(12) United States Patent
Miller

(10) Patent No.: US 12,061,016 B2
(45) Date of Patent: Aug. 13, 2024

(54) SOLAR CONCENTRATOR

(71) Applicant: Nativus, Inc., Sparks, NV (US)

(72) Inventor: Matthew C. Miller, Reno, NV (US)

(73) Assignee: NATIVUS, INC., Sparks, NV (US)

( * ) Notice: Subject to any disclaimer, the term of this patent is extended or adjusted under 35 U.S.C. 154(b) by 343 days.

(21) Appl. No.: 17/340,890

(22) Filed: Jun. 7, 2021

(65) Prior Publication Data

US 2021/0381724 A1    Dec. 9, 2021

Related U.S. Application Data

(60) Provisional application No. 63/036,864, filed on Jun. 9, 2020, provisional application No. 63/036,306, filed on Jun. 8, 2020.

(51) Int. Cl.
*F24S 23/79* (2018.01)
*F24S 23/70* (2018.01)
(Continued)

(52) U.S. Cl.
CPC .............. *F24S 23/79* (2018.05); *F24S 25/60* (2018.05); *F24S 50/20* (2018.05); *F24S 80/40* (2018.05);
(Continued)

(58) Field of Classification Search
None
See application file for complete search history.

(56) References Cited

U.S. PATENT DOCUMENTS 3,817,605 A * 6/1974 Franklin ............ G02B 19/0023
136/246
4,011,855 A * 3/1977 Eshelman ............... F24S 23/80
126/685

(Continued)

FOREIGN PATENT DOCUMENTS

KR          10-1172578 B1      8/2012
WO     WO 2007/104028 A2      9/2007

OTHER PUBLICATIONS

International Search Report and Written Opinion dated Nov. 17, 2021 for Application No. PCT/US2021/070671.
(Continued)

*Primary Examiner* — Edelmira Bosques
*Assistant Examiner* — Deepak A Deean
(74) *Attorney, Agent, or Firm* — Knobbe, Martens, Olson & Bear, LLP

(57) ABSTRACT

A reflective concentrator can include a primary reflector and a secondary reflector located radially outward of the primary reflector. The primary reflector can be a rotationally-symmetric, convex conical shape, radial sections of which may include an off-axis parabolic reflector with a focal point radially outward of the primary reflector. A secondary reflector may be located radially outward of the primary reflector, and may include a rotationally symmetric section of a toroidal space surrounding the primary reflector. In some embodiments, the secondary reflector may be convex or concave. Incident sunlight generally aligned with a rotational axis of symmetry of the primary reflector may be reflected off of the primary reflector, off of the secondary reflector, and back towards a point near the central peak of the primary reflector. The reflective concentrator may be aerodynamically stable, and may include an aerodynamic (Continued)

fairing on its read side to further increase the aerodynamic stability of the structure.

25 Claims, 21 Drawing Sheets

(51) Int. Cl.
    *F24S 25/00*     (2018.01)
    *F24S 25/60*     (2018.01)
    *F24S 50/20*     (2018.01)
    *F24S 80/40*     (2018.01)
    *H02S 20/32*     (2014.01)
    *H02S 40/22*     (2014.01)

(52) U.S. Cl.
    CPC ...... *F24S 2023/83* (2018.05); *F24S 2023/876* (2018.05); *F24S 2025/806* (2018.05); *H02S 20/32* (2014.12); *H02S 40/22* (2014.12)

(56) References Cited

U.S. PATENT DOCUMENTS

| | | | | |
|---|---|---|---|---|
| 4,148,297 A * | 4/1979 | Sherman, Jr. | ........... | F24S 23/80 126/573 |
| 4,148,298 A * | 4/1979 | Sherman, Jr. | ....... | H01L 31/0547 136/246 |
| 4,148,299 A * | 4/1979 | Sherman, Jr. | ......... | G01S 3/7861 136/246 |
| 5,899,071 A * | 5/1999 | Stone | ........................ | F02G 5/00 60/641.8 |
| 6,945,660 B2 * | 9/2005 | Arcos Gomar | ......... | F24S 23/70 359/853 |
| 8,710,414 B2 * | 4/2014 | Walden | .................... | F24S 23/00 136/246 |
| 10,895,406 B1 * | 1/2021 | Halverson | ........... | G02B 19/0019 |
| 2009/0159126 A1 | 6/2009 | Chan | | |
| 2010/0084017 A1 * | 4/2010 | Walden, Sr. | ............ | F24S 23/00 136/252 |
| 2011/0026130 A1 * | 2/2011 | Winston | ............... | G02B 19/008 359/857 |
| 2011/0100456 A1 * | 5/2011 | Walden | .................... | F24S 50/20 136/259 |
| 2011/0155123 A1 * | 6/2011 | Clue | ....................... | F24S 23/71 126/684 |
| 2011/0174359 A1 * | 7/2011 | Goei | ....................... | F24S 23/71 136/246 |
| 2012/0042652 A1 * | 2/2012 | Tarabishi | ................ | F03G 6/065 126/576 |
| 2015/0009567 A1 * | 1/2015 | Freier | ................... | F24S 30/452 359/597 |

OTHER PUBLICATIONS

Rahou et al. Direct transfer of solar radiation to high temperature applications. Nov. 2013 [retrieved on Nov. 10, 2021]. Retrieved from the internet. <URL: https://www.researchgate.neVfigure/Schematic-of-the-proposed-setup-of-parabolic-mirror-solarconcentrator_fig_1_261018205> entire document.

* cited by examiner

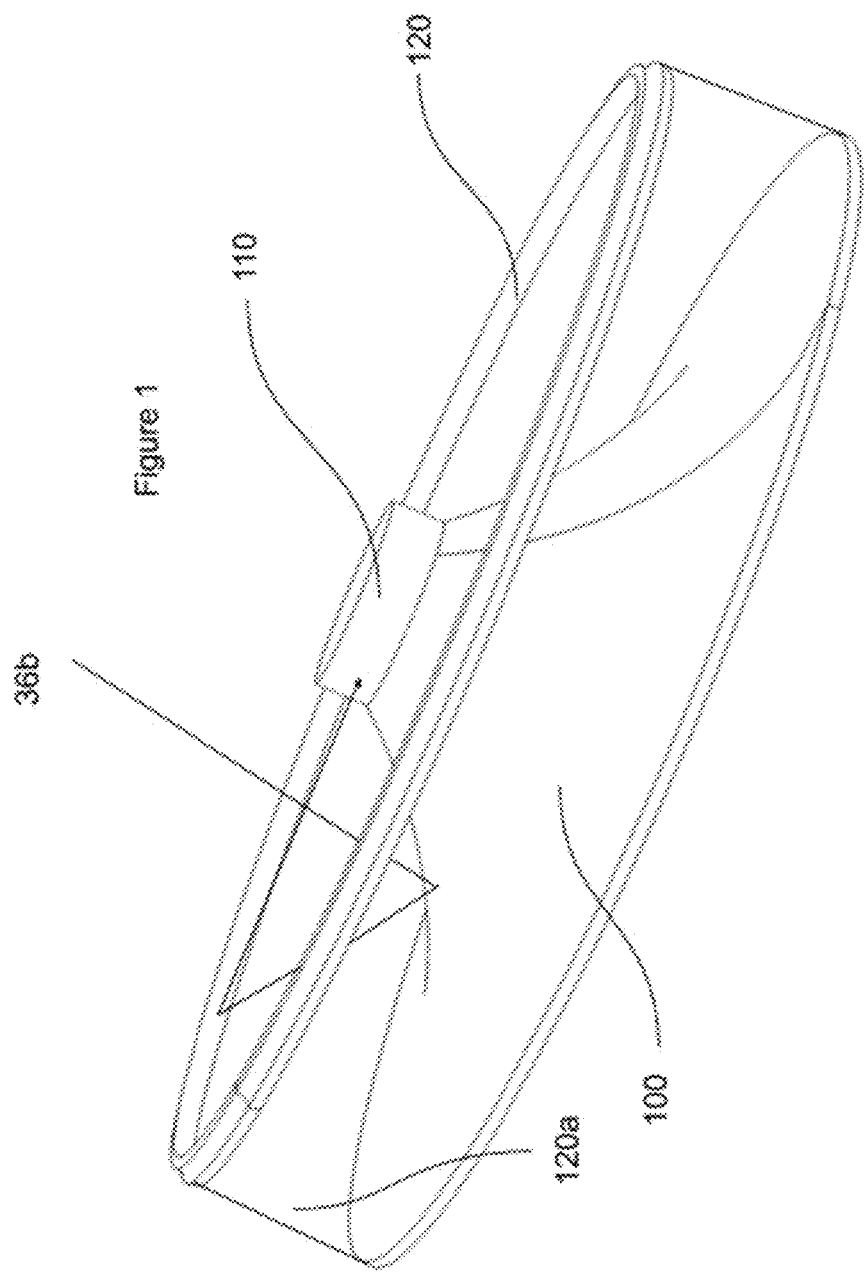

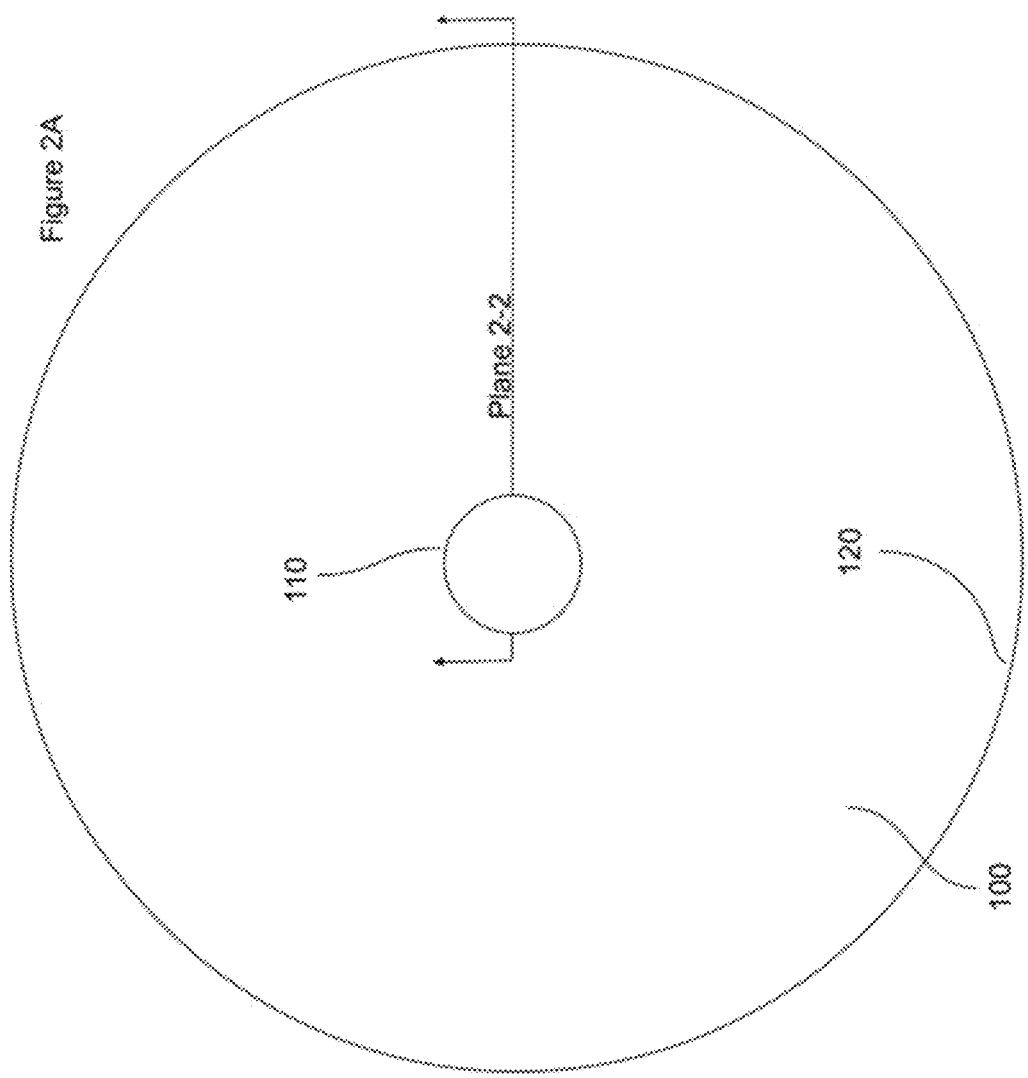

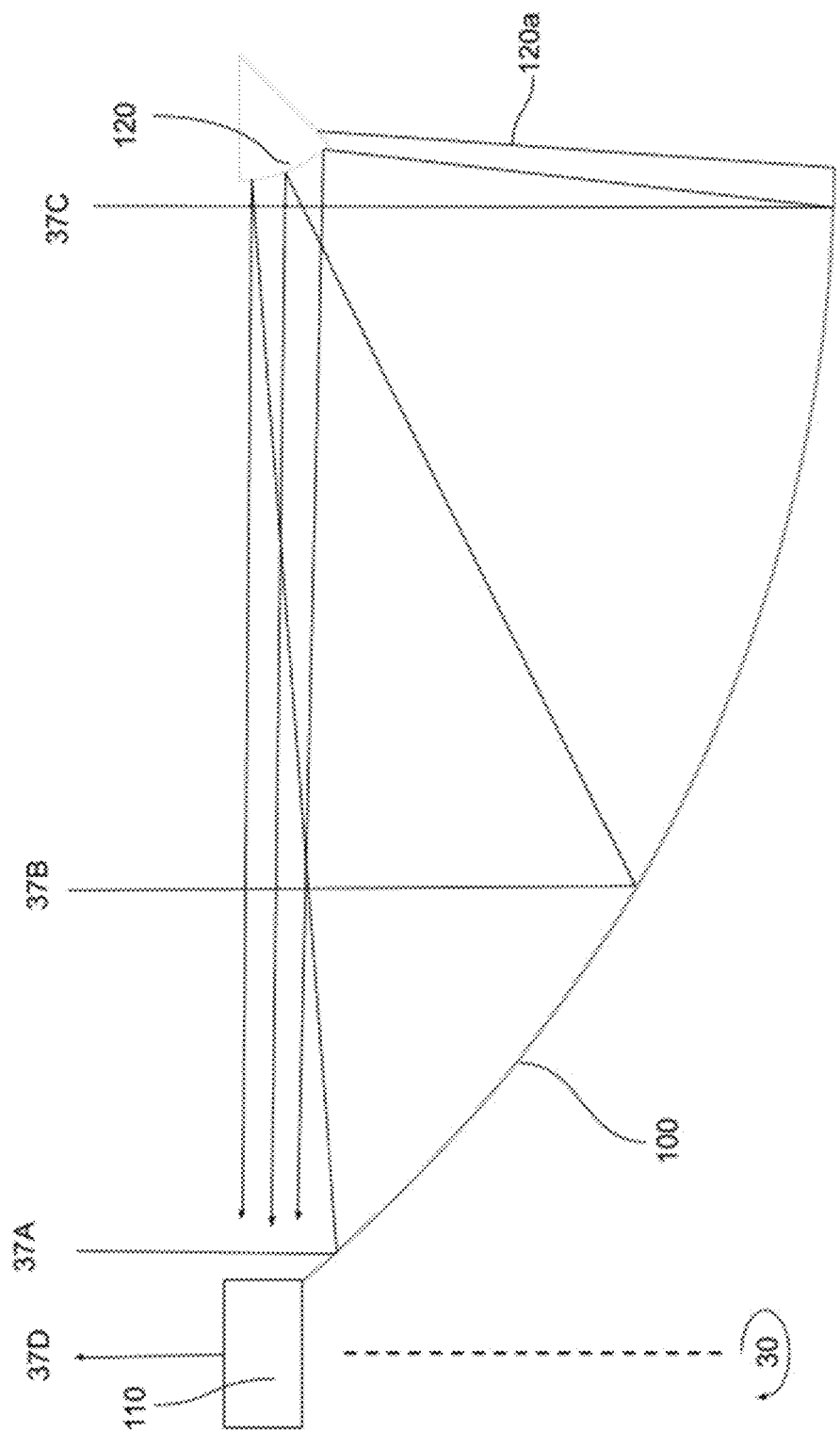

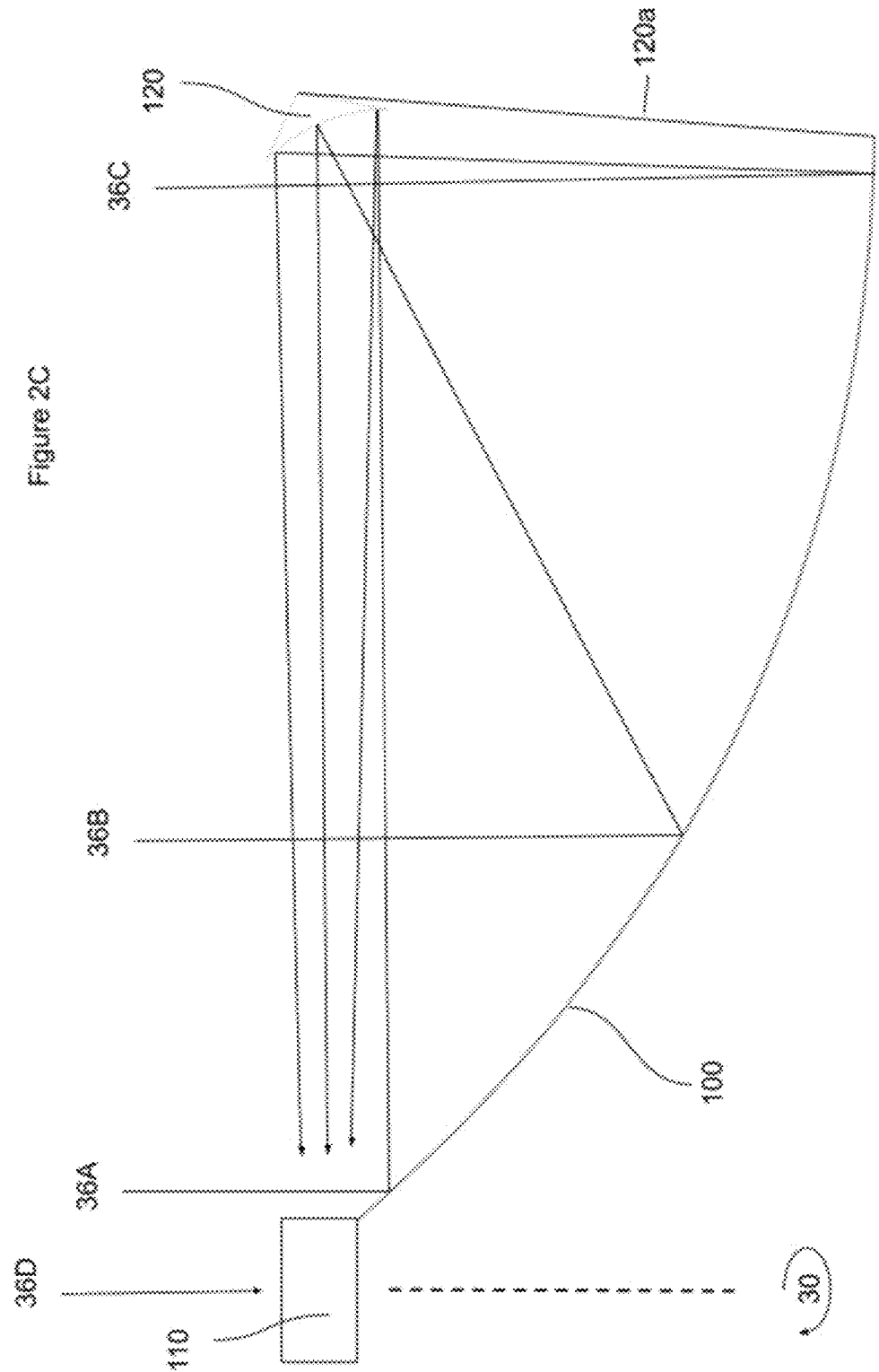

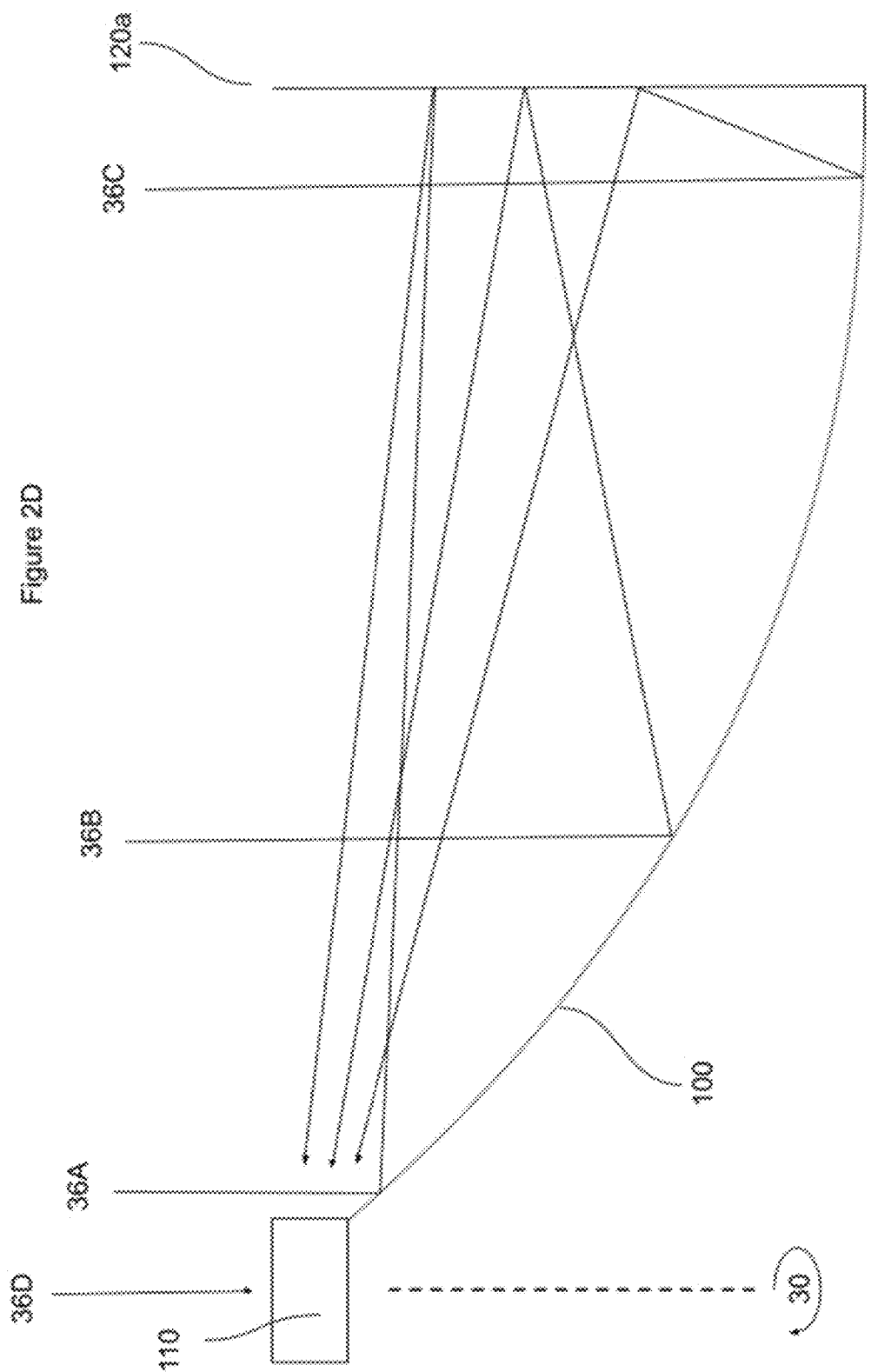

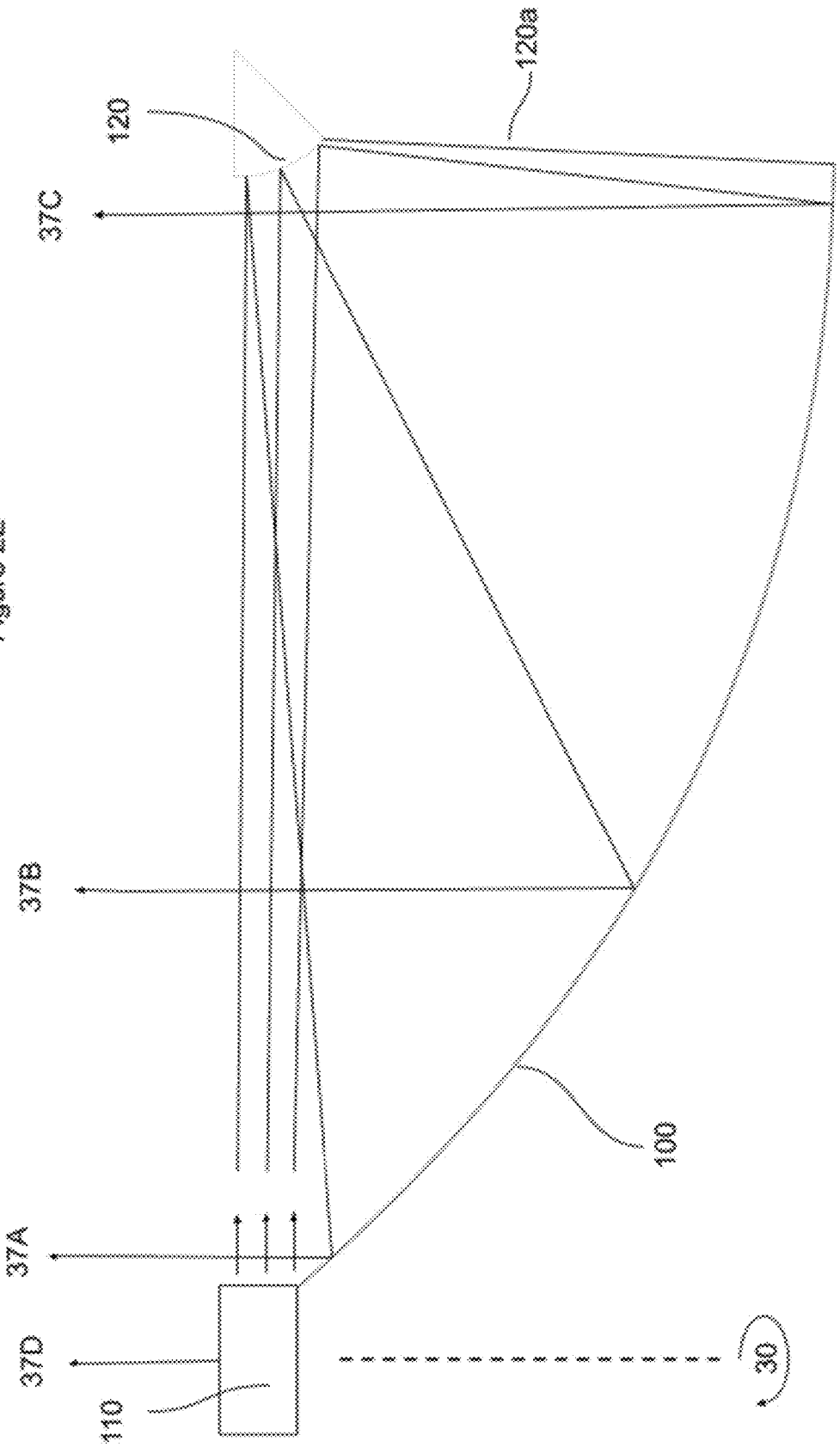

Cylindrical Mirror Geometry Constraint on $\phi_{HE}$

Fixed Parameters

| Parameter | Value |
|---|---|
| HE Diameter ($\phi_{HE}$) (mm) | 152.4 |
| HE Height ($h_{HE}$) (mm) | 127.0 |
| PM Radius (r3), (mm) | 2000 |
| SUN FOV +/- deg | 0.2667 |
| x | -1 |

Functions of f and fixed parameters

| Parameter | Value |
|---|---|
| f (mm) | 1000.00 |
| c (1/mm) | 5.000E-04 |
| 1/c | 2000.000 |
| c1 (mm) | 1000 |
| c2 (mm) | 1923.8 |
| c3 (mm) | 2000 |
| z1 (mm) | 250.0 |
| z2 (mm) | 925.3 |
| z3 (mm) | 1000.0 |

Results

| Parameter | Value |
|---|---|
| Primary Mirror height (mm) | 675.3 |
| Primary Mirror + HE Height | 802.3 |
| Cylindrical Reflector Height (mm) | 711.1 |
| θ1 (deg) | 36.9 |
| θ2 (deg) | 2.2 |
| θmid (deg) | 19.5 |
| h1 | 572 |
| h2 | 3.0 |
| $\phi_{s2}$, Spot Size on side of HE (mm) | 54.2 |

Figure 3B

| HE Surface | Z Position (mm) | Power Absorbed | Comments |
|---|---|---|---|
| 1 | 0 | 0.09% | Bottom Surface |
| 2 | -10 | 1.71% | |
| 3 | -20 | 8.02% | |
| 4 | -30 | 12.60% | |
| 5 | -40 | 14.54% | |
| 6 | -50 | 15.30% | |
| 7 | -60 | 14.40% | |
| 8 | -70 | 12.70% | |
| 9 | -80 | 9.39% | |
| 10 | -90 | 6.19% | |
| 11 | -100 | 3.20% | |
| 12 | -110 | 1.08% | |
| 13 | -120 | 0.16% | |
| 14 | -130 | 0.00% | |
| 15 | -140 | 0.58% | Top Surface, Direct Sun Illumination |
| | TOTAL | 100% | |

Figure 4F

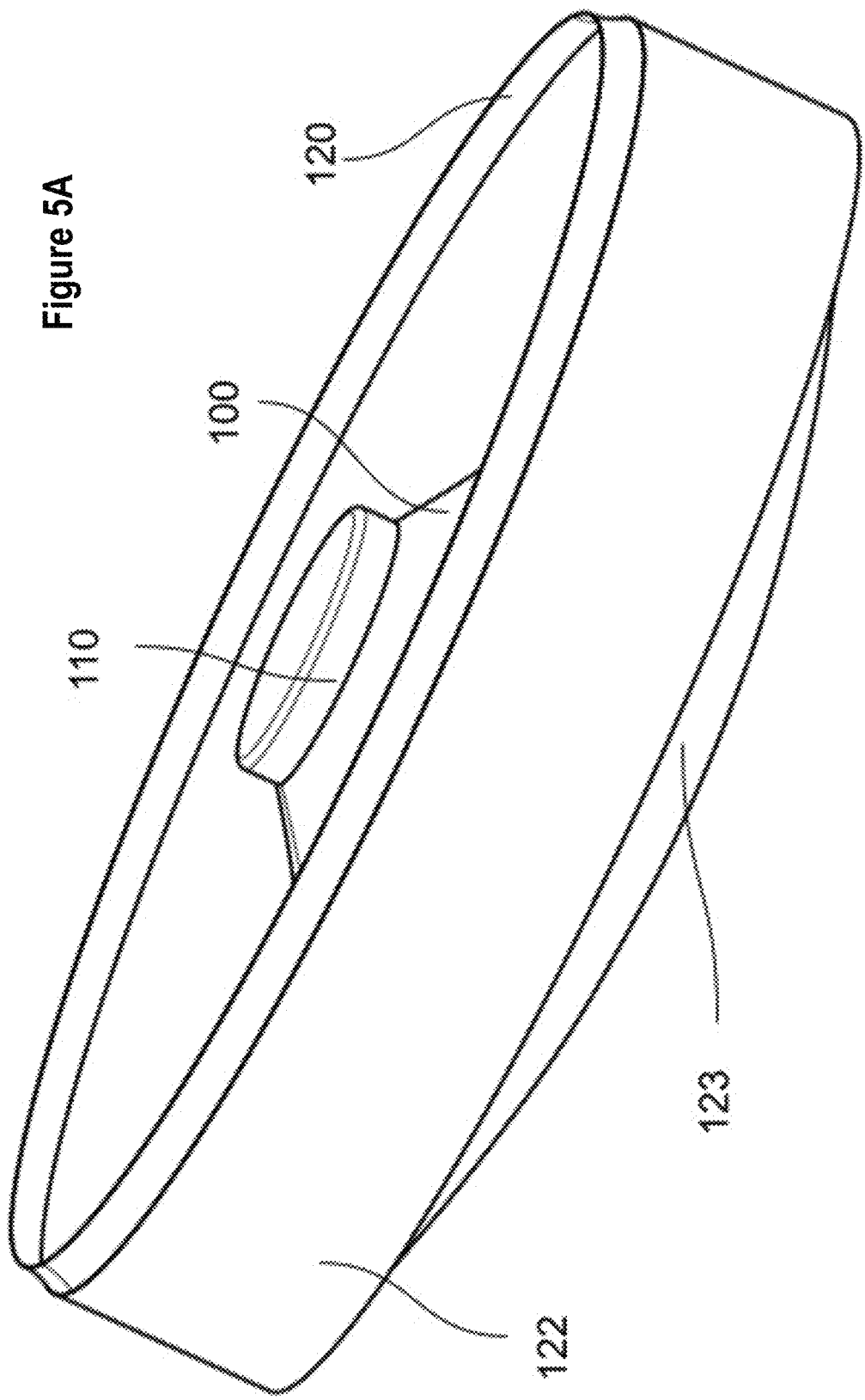

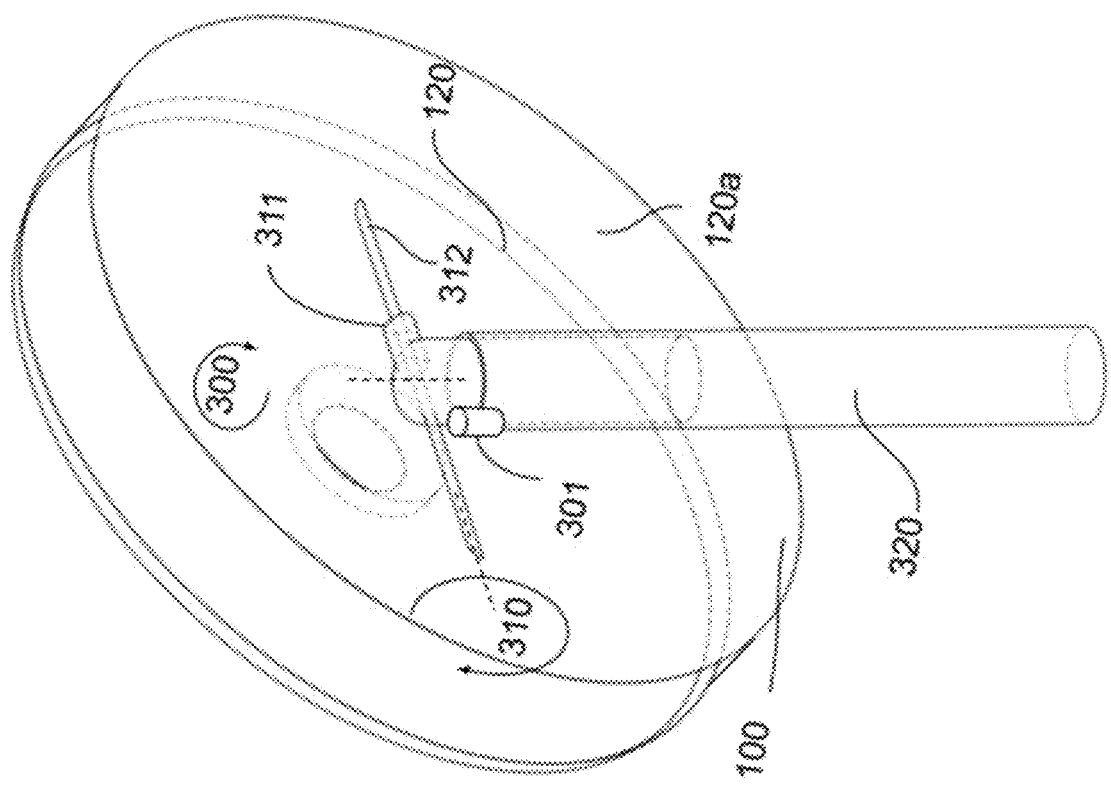

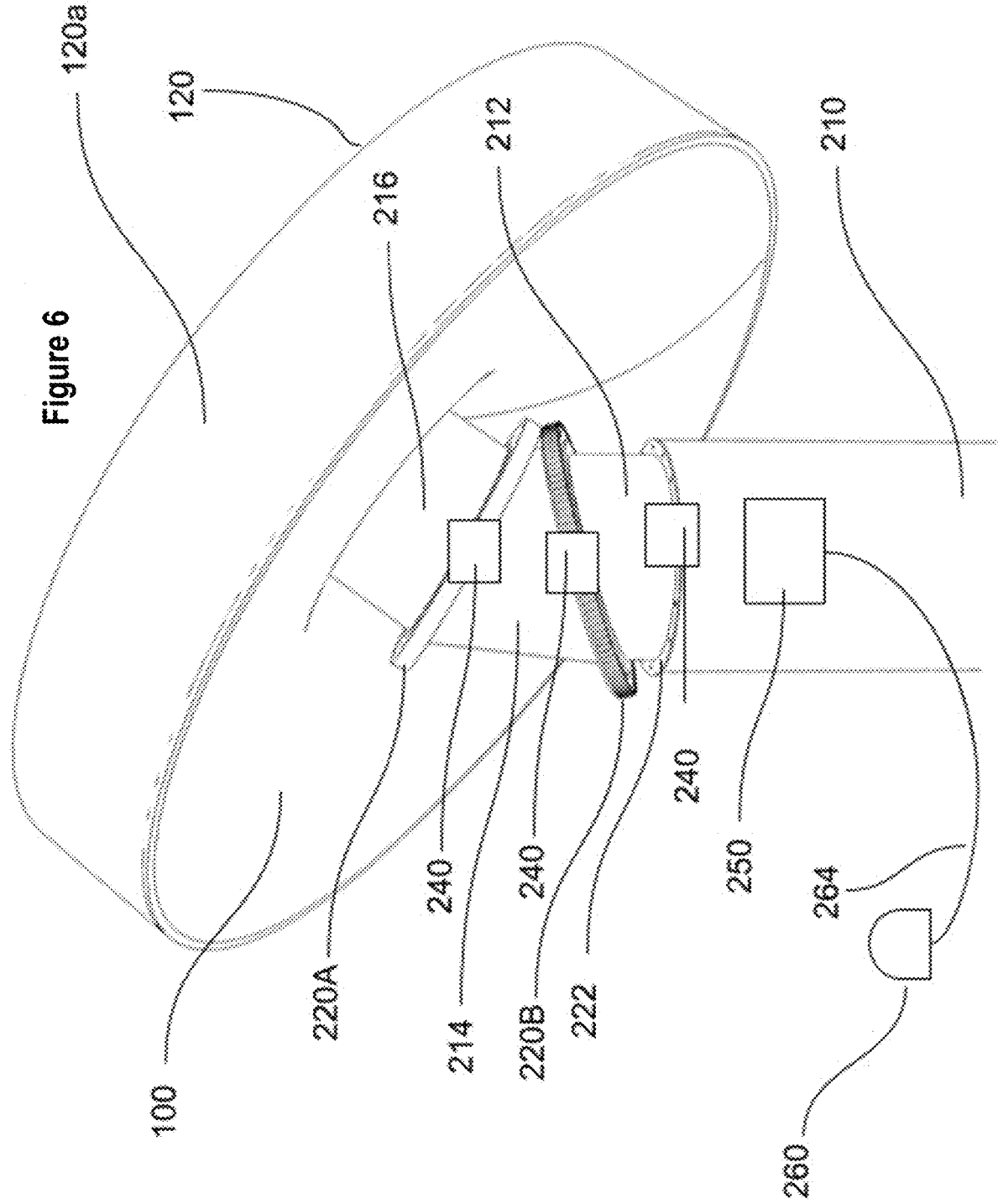

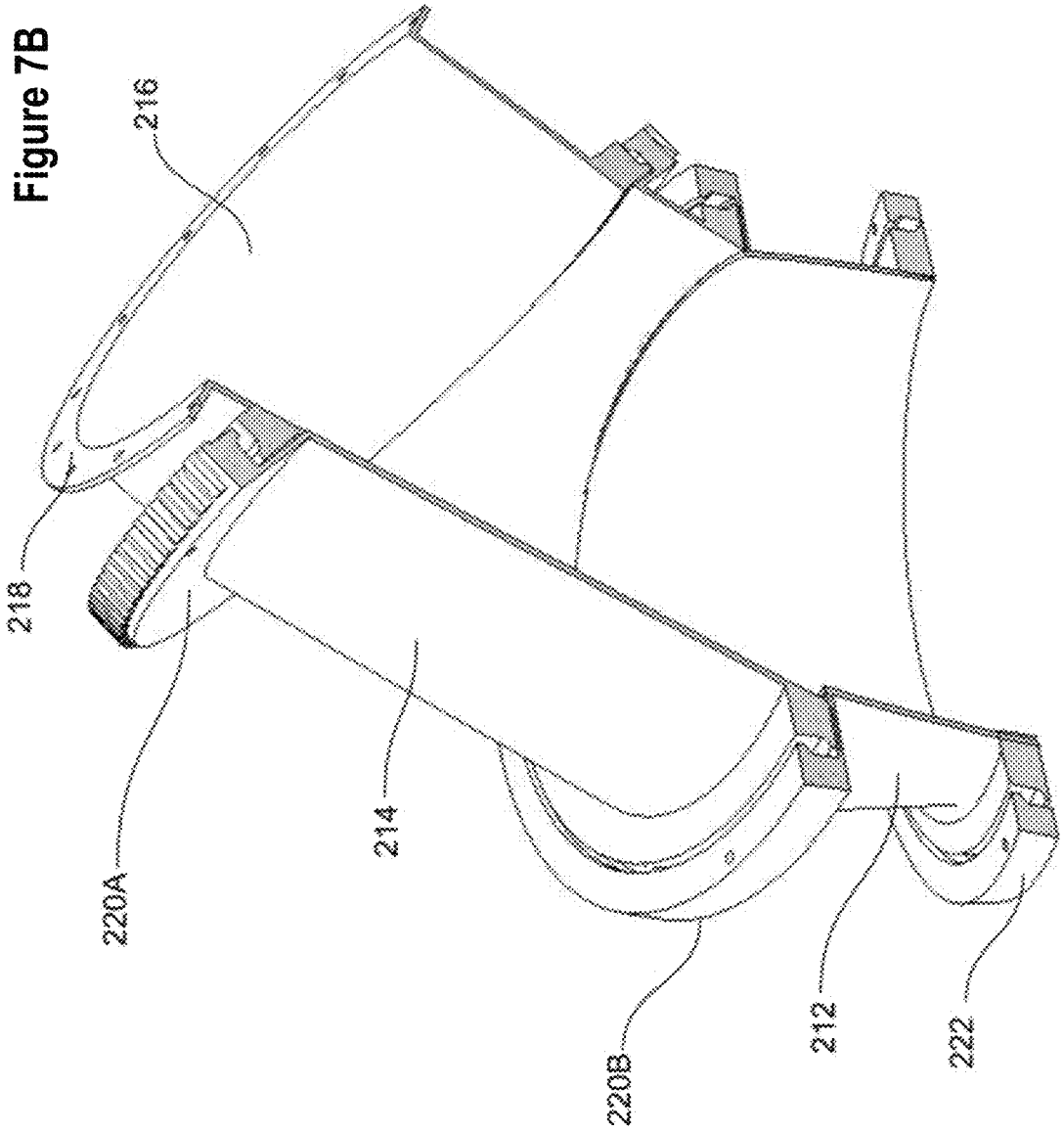

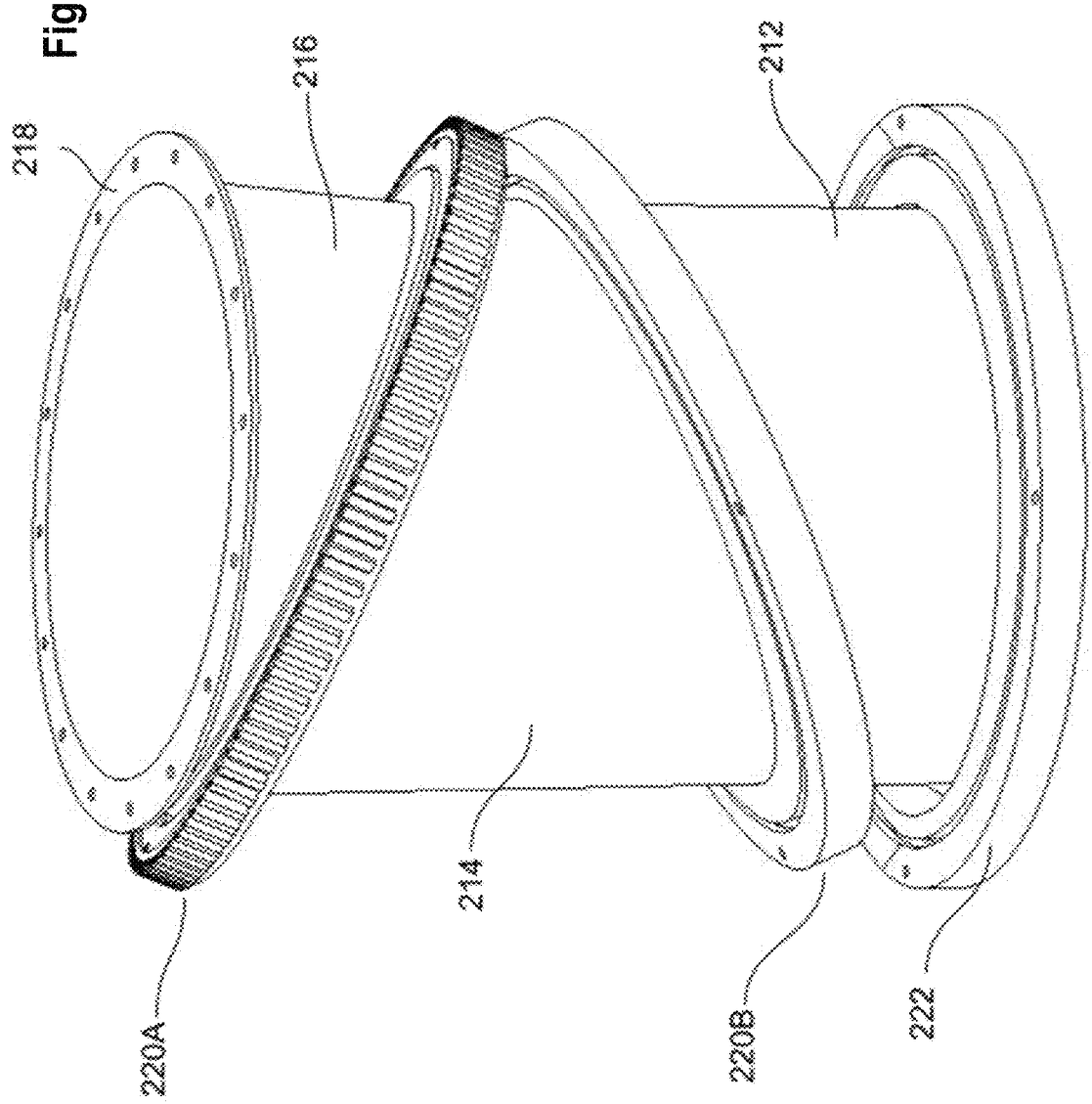

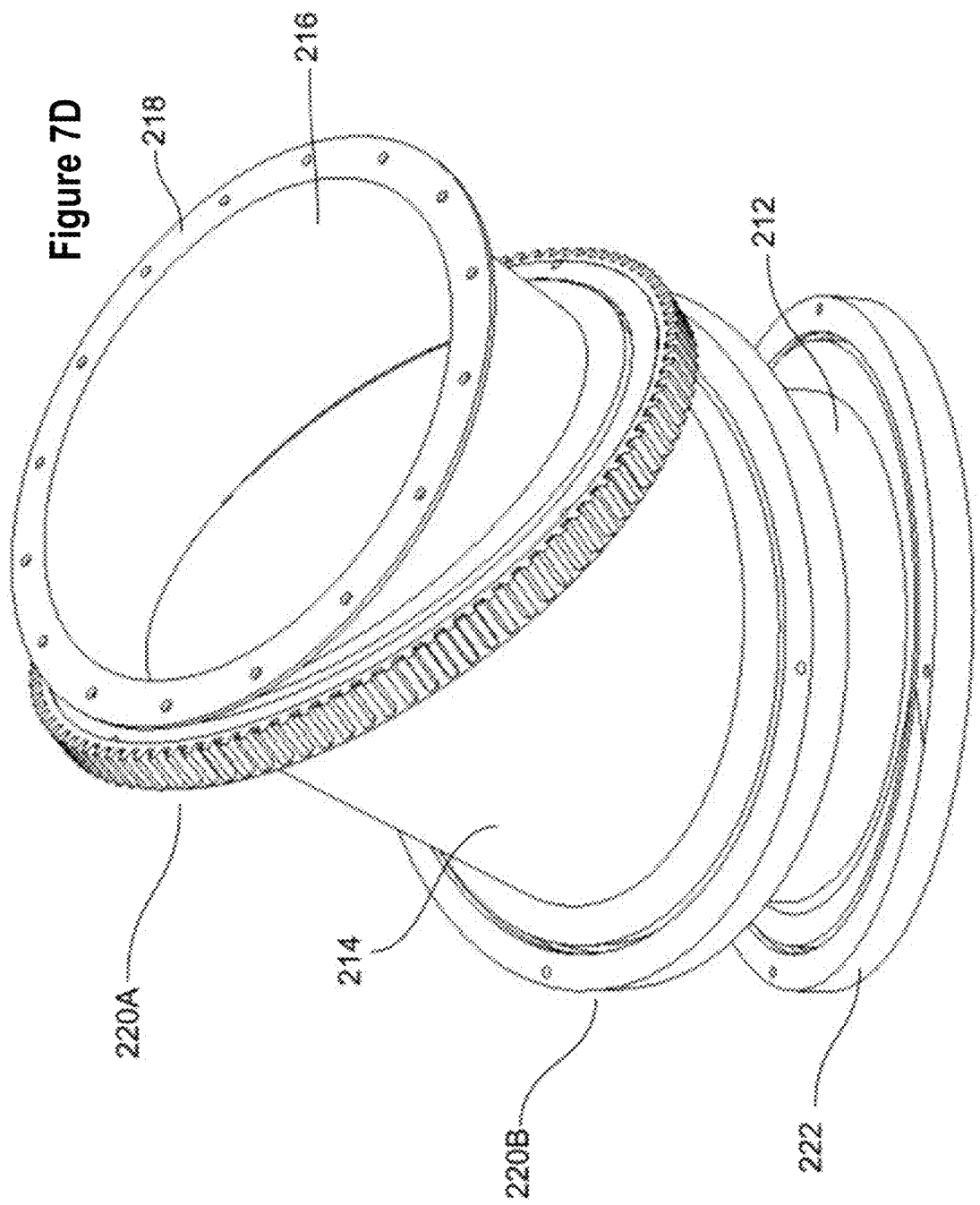

SOLAR CONCENTRATOR

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims the benefit of U.S. Provisional Application No. 63/036,306, filed Jun. 8, 2020, and U.S. Provisional Application No. 63/036,864, filed Jun. 9, 2020, the disclosures of each of which are hereby incorporated by reference in its entirety.

BACKGROUND

Technical Field

Innovations described herein relate to devices which can be used to shape radiative transfer, and in particular to device which can be operated as electromagnetic radiation receivers and/or transmitters, such as devices which can be operated as concentrators of collected solar power.

Description of the Related Art

Solar power collectors can utilize reflective surfaces as part of the collector to concentrate solar rays onto a target. However, existing parabolic or other dish-shaped solar collectors, as well as similar dish-shaped structures used in other forms of electromagnetic radiation collection, reception, or transmission, can have form factors with depths which are substantially the same as their width. This can present a number of problems, as these dish-shaped structures are often mounted at high elevations on dedicated towers. Because these structures may have aerodynamic profiles which result in exposure to high drag forces, there are significant constraints on the placement and design of these dish-shaped collecting, receiving, and/or transmitting structures and on the structures supporting them.

SUMMARY

In one broad aspect, a solar collector is provided, including a primary reflector including a concave conical surface symmetrical about a central axis of the solar collector and configured to redirect substantially all incident sunlight parallel to the central axis through a toroidal region rotationally symmetrical about the central axis, and a secondary reflector configured to redirect substantially all of the parallel incident sunlight redirected from the first primary reflector towards a collector region near a peak of the primary reflector.

The toroidal region can be one of concave or convex The toroidal region can be one of parabolic, circular, cylindrical, or tilted conical.

The secondary reflector can include a rotationally symmetric concave reflective surface facing the primary reflector, the reflective surface substantially identical in shape to a boundary of the toroidal region facing the primary reflector. The secondary reflector can include a rotationally symmetric convex reflective surface facing the primary reflector, the reflective surface substantially identical in shape to a boundary of the toroidal region facing the primary reflector.

The secondary reflector can be located radially outward of the primary reflector. The secondary reflector can be supported by a plurality of support components extending between the secondary reflector and the primary reflector, at least some of the plurality of support components being spaced apart from one another to allow airflow therebetween.

The radius of the toroidal region can be substantially greater than the thickness of the toroidal region, or more than 4 times the thickness of the toroidal region.

The parallel incident sunlight redirected from the secondary reflector to the collector region can be substantially parallel with a plane orthogonal to the central axis of the solar collector. The parallel incident sunlight redirected from the secondary reflector to the collector region can be redirected at angles parallel to or slightly downward towards the primary reflector The solar collector can additionally include a heat engine positioned within the collector region near the peak of the primary reflector. The heat engine can include an evaporator region, and a substantial percentage of the parallel incident sunlight redirected from the secondary reflector can be incident upon the evaporator region of the heat engine.

The solar collector can include an aerodynamic fairing disposed on the side of the primary reflector opposite the concave conical surface. The primary reflector and aerodynamic fairing can define an aerodynamically stable structure.

The solar collector can additionally include an elevation axis mount configured to allow the elevation of the primary reflector to be adjusted. The solar collector can additionally include an azimuthal motor configured to allow the rotational position of the primary reflector to be adjusted. The solar collector can be supported by a ground mount support, and wherein the solar collector additionally includes a radially extending fairing support track along which the ground mount support can translate when the elevation of the primary reflector is adjusted.

In another broad aspect, a reflective concentrator is provided, including a primary reflector including a rotationally symmetric concave conical reflective surface, each radial section of the concave conical reflective surface including an off-axis parabolic section having a first focal length and a focal point radially outward of the primary reflector, and a secondary reflector including a rotationally symmetric reflective surface located at least partially radially outward of the primary reflector.

The secondary reflector can include a concave surface facing the primary reflector. The reflective concentrator can include a convex surface facing the primary reflector. The secondary reflector can include a recollimating structure configured to redirect light reflected by the primary reflector back towards a target located near the center of the primary reflector.

In another broad aspect, a tracker for use with a radiative transfer shaping assembly is provided, including a first cylindrical base section, a second cylindrical base section axially aligned with the first cylindrical base section, a first swivel bearing disposed between the first cylindrical base section and the second cylindrical base section, a cylindrical intermediate section having a first end and a second end oriented at an angle to one another, a second swivel bearing disposed between the second cylindrical base section and the first cylindrical intermediate section, the second swivel bearing disposed at a fixed first angle relative to the first swivel bearing, a cylindrical support section having a distal end for supporting a radiative transfer shaping assembly, and a third swivel bearing disposed between the cylindrical intermediate section and the cylindrical support section, the third swivel bearing disposed at a fixed second angle relative to the second swivel bearing.

The first swivel bearing can allow the second cylindrical base section to rotate relative to the first cylindrical base section while remaining axially aligned with the first cylindrical base section. The first cylindrical base section can have first and second ends parallel to a plane orthogonal to a central axis of the first cylindrical base section. The second cylindrical base section can have a first end adjacent the first swivel bearing and parallel to a plane orthogonal to a central axis of the first cylindrical base section, and a second end adjacent the second swivel bearing and canted at an angle to the plane orthogonal to the central axis of the first cylindrical base section.

Rotation of the first swivel bearing can adjust the azimuth of the solar tracker without adjusting the elevation of the radiative transfer shaping assembly. Rotation of the second and third swivel bearings can alter the angle between the plane of the third swivel bearing and the plane of the first swivel bearing. Rotation of the second and third swivel bearings can alter the elevation of the distal end of the radiative transfer shaping assembly. The cross-sectional diameter of the tracker can be substantially the same diameter as the large diameter of an EM transceiver, with the tracker acting as walls to a dwelling structure, with the EM transceiver acting as the roof.

BRIEF DESCRIPTION OF THE DRAWINGS

FIG. 1 is a perspective view of a solar concentrator including two reflective surfaces arranged coaxially around a central target.

FIG. 2A is a plan view of the solar concentrator coaxial arrangement of the primary and secondary collector surfaces and the central target area.

FIG. 2B is a cross-sectional side view of the solar concentrator of FIG. 1, along a plane 2-2 of FIG. 2A, bisecting and parallel with the axial line of symmetry, a convex secondary reflector and resultant ray-paths.

FIG. 2C is a cross-sectional side view of the solar concentrator of FIG. 1, along a plane 2-2 of FIG. 2A, bisecting and parallel with the axial line of symmetry, a concave secondary reflector and resultant ray-paths.

FIG. 2D is a cross-sectional side view of the solar concentrator of FIG. 1, along a plane 2-2 of FIG. 2A, bisecting and parallel with the axial line of symmetry, a conical secondary reflector and resultant ray-paths.

FIG. 2E is a cross-sectional side view of the transmitter of FIG. 1, along a plane 2-2 of FIG. 2A, bisecting and parallel with the axial line of symmetry, a convex secondary reflector and central emitter and resultant transmission ray-paths.

FIG. 3B is a table illustrating the system parameters and calculated spot size for given parameters of the system of FIG. 3A.

FIG. 4F shows a table showing the percentage of power absorption for each of the plates.

FIG. 5A is a perspective view of the reflective concentrator surfaces of FIG. 1 and fairing.

FIG. 5C is a rear perspective view of the reflective concentrator surfaces and target area of the solar concentrator of FIG. 1 including two axis tracker system in a second position and ground mount.

FIG. 6 is a perspective view of a three bearing swivel tracking mechanism and reflector system of FIG. 1.

FIG. 7B is a perspective cross section view of the three bearing swivel tracking mechanism of FIG. 7A.

FIG. 7C is a perspective view of the three bearing swivel tracking mechanism of FIG. 7A in a first position.

FIG. 7D is a perspective view of the three bearing swivel tracking mechanism of FIG. 7A in a second position.

Like reference numbers and designations in the various drawings indicate like elements. Note that the relative dimensions of the figures may not be drawn to scale.

DETAILED DESCRIPTION

Figure 3A:
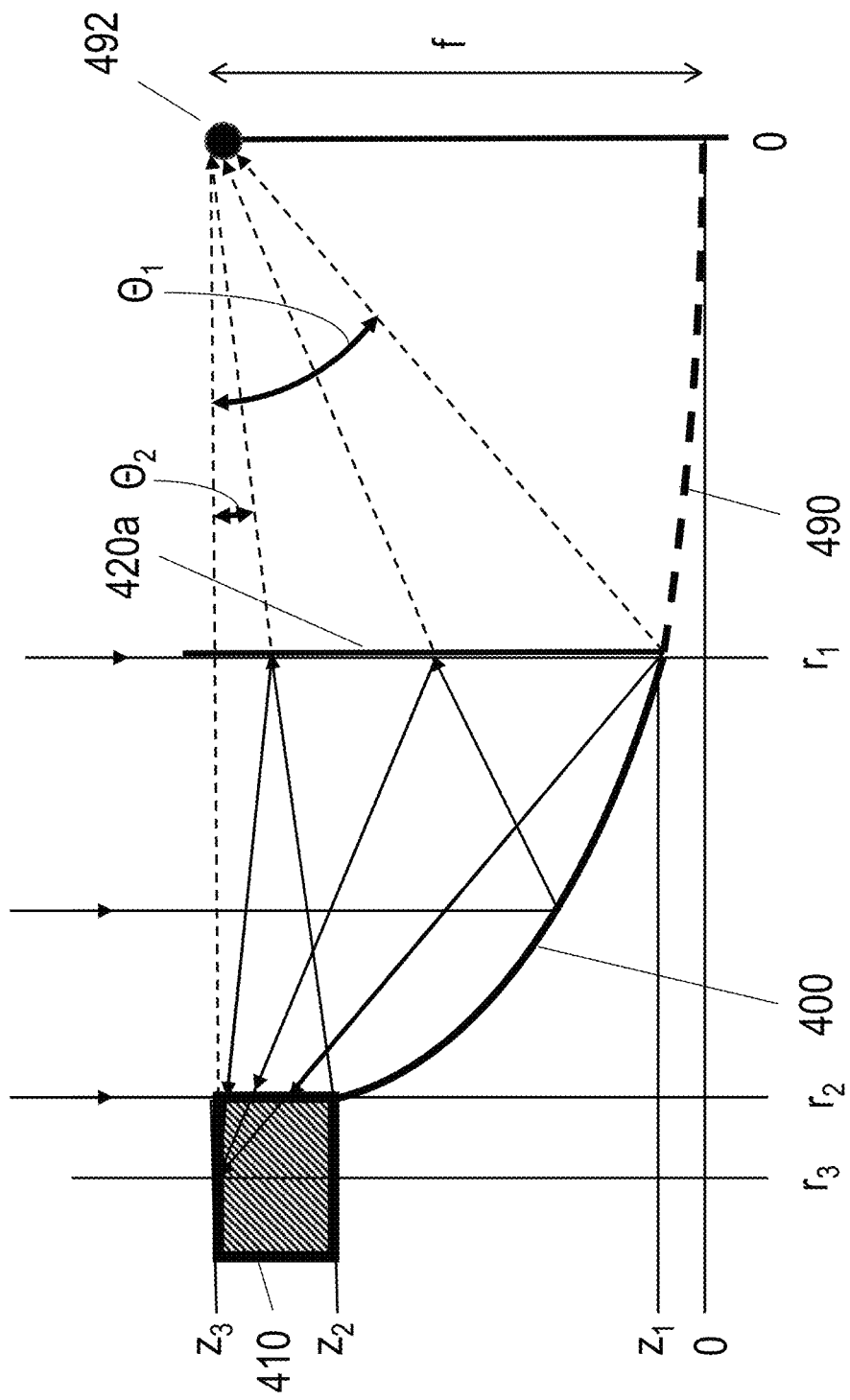
FIG. 3A schematically illustrates the operation of an arrangement of a primary and secondary reflector relative to a heat exchanger, such as the arrangement of FIG. 2D.

A set of two reflecting surfaces can be used in conjunction with a tracker system to gather and focus sunlight onto a central target. Although certain embodiments are described herein with respect to use as a solar concentrator, similar structures can be used in a wide variety of other applications. The illustrated structures and resulting ray paths may also be used to illustrate transmission by a transmitter system from a central emitter.

In one aspect, reflective structures described herein can be configured to alter a pattern of incident or emitted radiation. For example, the structure may be configured to redirect incident solar radiation, and focus that radiation, through a series of reflections, on a desired location. The concentrated solar radiation may be used in solar power generation, or may be used directly as a heat source.

In other embodiments, however, similar structures may be used to collect other forms of electromagnetic radiation, concentrating them on a receiver or similar structure. Alternately or in addition, a transmitter may be positioned at a central point of such a structure, and the reflecting surfaces used to redirect emitted radiation in a desired pattern, such as a generally collimated and compact pattern. The reflective structures described herein may form part of an electromagnetic transceiver, receiver, or transmitter, and may be used to direct electromagnetic radiation towards a target at a central location, and/or to transmit electromagnetic radiation emitted at the central location. A tracking mechanism may be used to alter the orientation of the reflective structure. The reflective structure may be a non-imaging structure.

The reflective structure may include first and second reflective sections which operate together as a double-reflection device. The first reflective section may be a concave shape, such as a concave pyramidal shape which tapers upwards towards the central target section of the reflective structure. The second reflective section may be a concave or convex reflector which subsequently focuses radiation incident upon and reflected by the primary reflector towards the central target. The second reflective section may be radially symmetrical and located radially outward of substantially all of the primary reflector.

In some embodiments, both the primary and secondary reflectors have circular shapes. The central target may be centrally situated above the primary reflector, and centrally situated and equidistant from the surrounding portions of the secondary reflector. The secondary reflector may be at least partially coplanar with the central target location.

Because the primary reflector may be largely separate from the secondary reflector, the aerodynamic profile may be optimized to reduce drag forces exerted by wind. In addition, because the structure can be substantially wider in shape than it is deep, the aerodynamic profile may be further optimized to reduce drag forces exerted by wind.

An aerodynamic fairing on the back of the structure may also be used to provide a desired aerodynamic profile, and the fairing and other structures can be used to disrupt or divert air flow in a desired manner.

The tracking device may be configured to track the sun or another electromagnetic radiation source in both azimuth and elevation. The tracking device may be a mechanical tracking device. The tracking device may include a multi-bearing swivel duct structure, actuated by a motor or other suitable actuation structures. It may be rigidly mounted between a support and the underside of the reflective structure.

The reflective structure may have a component of a solar power generation system located at the central target location. This component may be a solar-thermal power generator, a concentrated solar photovoltaic power generator, or a heat transfer structure such as a fluid conduit which can be used to transfer the collected heat to a turbine or other converter either internal to or external to the collection structure.

In some embodiments, an example of which is illustrated and described in the attached Appendix, the structure positioned in the target location may include a plurality of plates oriented normal to the axis of symmetry of the reflective structure, to capture solar power. In some embodiments, these plates or fins may form a part of a heat exchanger with at least some components located in the target area. In some embodiments, one or more of the facing surfaces may include a photovoltaic panel. Because the plates may be closely spaced relative to the dimensions of the facing surfaces, the plates will radiate at one another and effectively capture and trap energy therein.

FIG. 1 is a perspective view of a solar concentrator including two reflective surfaces arranged coaxially and operating together as a double reflection device. The primary mirror 100 has a unique concave shape, which can be used to concentrate solar power onto the secondary reflector 120. The secondary reflector 120, as illustrated, is situated at a common radius to the primary reflector.

The reflector set gathers sunlight and focuses it onto a central target area 110. In contrast to a solar concentrator whose secondary reflector and secondary reflector support shades the primary reflector surface from solar rays, the double reflector set of the illustrated embodiment allows for the entirety of the available solar rays to be focused on the central target area 110. The secondary reflector surface is supported by the secondary reflector support 120a, which additionally gives structural support to both reflector surfaces.

In the illustrated embodiment, light ray 36a is incident upon and reflected by the primary reflector 100, in the direction of the secondary reflector 120. The primary reflector 100 is shaped such that all radiation incident upon the primary reflector 100 at an angle normal to the overall collector will be reflected towards the secondary reflector 120. In other words, when the collector is positioned such that a central axis, or axial line of symmetry, of the collector is pointed at a radiation source, such as the sun, all of the radiation from that source will be reflected by the primary reflector 100 outwards toward the secondary reflector 120. The secondary collector, in turn, is configured to reflect all of the reflected radiation back inwards and towards the central target 110 located at the central target location of the collector.

The illustrated reflector arrangement allows substantially all of the incident radiation aligned with an axial line of symmetry of the reflectors to be reflected towards the target. In particular, when this assembly is pointed at the sun so that the sun is aligned with the axis of symmetry of the reflectors, this reflector assembly allows substantially all of the sunlight incident upon the reflector assembly to be reflected towards the central target. Reflectors of this type can have zero spherical aberration, as well as no Coma, another blurring effect.

FIG. 2A shows a plan view of the solar concentrator coaxial arrangement of the primary and secondary collector surfaces and the central target area.

FIG. 2B is a cross-sectional side view of the solar concentrator of FIG. 1, along a plane 2-2 of FIG. 2A, bisecting and parallel with the axial line of symmetry, a convex secondary reflector and resultant ray-paths. The reflector system can be generated by rotating the cross section shown in FIG. 2B symmetrically around axis 30. Light ray 37A, which is incident upon the primary reflector 100 at a location close to the central target 110, is reflected outwards with a slight incline towards secondary reflector 120, while light ray 37C, which is incident upon the primary reflector 100 at a location near the outer edge, far from the central target 110, is reflected at a near-vertical angle to the secondary reflector 120. After being reflected by the secondary reflector 120, all of the light rays travel along near-parallel paths towards the central target 110.

The secondary surface may be a section of a torus, and may be made using, for example, a bent pipe or other cylinder, which can be sectioned into a usable reflector surface. This may be done directly, or using another suitable process, such as being hydroformed into final shape in a mold.

Secondary reflector support 120a rigidly attaches to primary reflector surface 100 and secondary reflector surface 120. In some embodiments, secondary reflector support 120a can be a solid structure, while in other embodiments the secondary reflector support 120a may be a pattern, mesh, or other series of support members having spaces therebetween to allow airflow through. The rim of the primary reflector 100 thus supports the secondary reflector 120, and the secondary reflector support 120a remains out of the sunlight when the reflector assembly is tracked to maintain alignment with the sun.

In some embodiments, the secondary reflector surface 120 may itself be a primary or secondary target of the reflective device. For example, the secondary reflector surface 120 may be a surface of a tube filled with water or another fluid, and which can be heated by the light reflected at the secondary reflector surface 120 by the primary reflector surface 100. This may allow the use of such a structure to provide solar water heating, for example, either as the primary function of the device or as a secondary function.

FIG. 2C is a cross-sectional side view of the solar concentrator of FIG. 1, along a plane 2-2 of FIG. 2A, bisecting and parallel with the axial line of symmetry, a concave secondary reflector and resultant ray-paths.

FIG. 2D is a cross-sectional side view of the solar concentrator of FIG. 1, along a plane 2-2 of FIG. 2A, bisecting and parallel with the axial line of symmetry, a conical secondary reflector 120a and resultant ray-paths. In this instance, the radially inward facing surface of support structure 120a is reflective, and acts also as the secondary reflective surface 120 returning solar rays to the central target 110.

As noted above, in some embodiments, the secondary reflector can be a primary or secondary target of the collected sunlight or other electromagnetic radiation. In such an embodiment, particularly in an embodiment such as that of FIG. 2D where the radially inward facing surface of support structure 120a acts also as the secondary reflective surface 120, the radially inward facing surface of support structure 120a can comprise one or more photovoltaic solar panels. In some embodiments, the entire secondary reflective surface 120 can be a photovoltaic solar panel.

FIG. 2E is a cross-sectional side view of the transmitter of FIG. 1, along a plane 2-2 of FIG. 2A, bisecting and parallel with the axial line of symmetry, a convex secondary reflector and central emitter and resultant transmission ray-paths. The two reflector system can act as either a receiver, compressing incoming rays onto a central target, or act as a transmitter, sending rays from a central emitter radially outward to reflect off of surface 120 followed by reflection off of surface 100 and transmission rays in the direction of 37A, 37B, and 37C. These two functions of transmission and reception can be performed simultaneously with the system acting as a transceiver. Reflector configurations shown in FIGS. 2B, 2C, and 2D can all operate in the receiver, transmitter, or transceiver modes of operation.

Although incoming solar rays are discussed, it should be noted that all forms of electromagnetic radiation can be received and/or transmitted to and from a central target with the two surface reflectors shown here. These include but are not limited to waves of differing frequency like radio waves, microwaves, infrared radiation, visible light, ultraviolet radiation. X-rays and gamma rays.

The design and operation of the primary reflective surface can be described, for example, with respect to the arrangement of FIG. 2D, in which the secondary reflective surface 120a comprises a cylindrical shape at the edge of the primary reflector 100. As noted above, a parabolic mirror has the unique property of focusing collimated light onto a single point without any spherical aberration, unlike a spherical mirror in which spherical aberration causes the focus to be blurred and limits the practical collection aperture. For light sources of a given size, however, such as the sun, some of the light incident upon the parabolic mirror will be off-axis, resulting in a blurring effect which results in distortion.

The expected spot size $\phi$ of a light source for a parabolic mirror of focal length f is nominally given, in the absence of coma aberration, by $\phi=2*f*\tan(\Theta)$, where $\Theta$ is the half-angle of the light source. As a light source, the sun's size and distance can be treated as a point source at infinity covering +/−0.267 degrees. For an off-axis parabolic (OAP) reflector with a focal length of 1 mm and an aperture of 1 m, offset by 1.5 m, the expected spot size of the sun would be about 9 mm. When coma is taken into account, the simulated spot size is roughly double, about 18.6 mm. So long as the target of the OAP reflector is large compared to the coma-adjusted spot size, the coma aberration inherent in the operation of the OAP reflector will not have a significant impact on the efficiency of the transmission of reflected energy to the target.

FIG. 3A schematically illustrates the operation of an arrangement of a primary and secondary reflector relative to a heat exchanger, such as the arrangement of FIG. 2D. The primary reflector 400 is a section of a parabolic shape 490 having a focal point 492 which is at or near the top of the heat exchanger 410, and positioned radially at a distance $r_3$ from the center of the heat exchanger 410. A secondary reflector 420a in the form of a cylindrical mirror, which in the plane of FIG. 3A is a flat mirror, is positioned midway between the center of the exchanger 410 and the focal point 492, so that the reflected solar energy from the sun is focused at the top center of the heat exchanger 410.

For a parabolic primary reflector 400, the vertical position, z position, or sag, as a function of radial distance r from the focal point 492 is given by $z=r^2/2f$, where f is the focal length of the primary mirror. When the parabolic shape 400 defining the primary reflector 400 passes through the top center of the heat exchanger, the focal length f is equal to the height $z_3$ of the parabolic shape 400, and f can be calculated. The radial position $r_2$ of the outer edge of the heat exchanger 410 and the radial position $r_1$ of the secondary reflector 420a can also be calculated, as can the angles of incidence $\Theta_1$ and $\Theta_2$ of the extreme rays incident immediately adjacent the inner and outer edges of the primary reflector 400. The geometrical spot size incident on the outer circumference of the heat exchanger 400 can be estimated as $\phi_{s2}=h_1-h_2$, where $h_1$ is the radius of the heat exchanger multiplied by the tangent of $\Theta_1$, and $h_2$ is the radius of the heat exchanger multiplied by the tangent of $\Theta_2$.

Figure 3C:
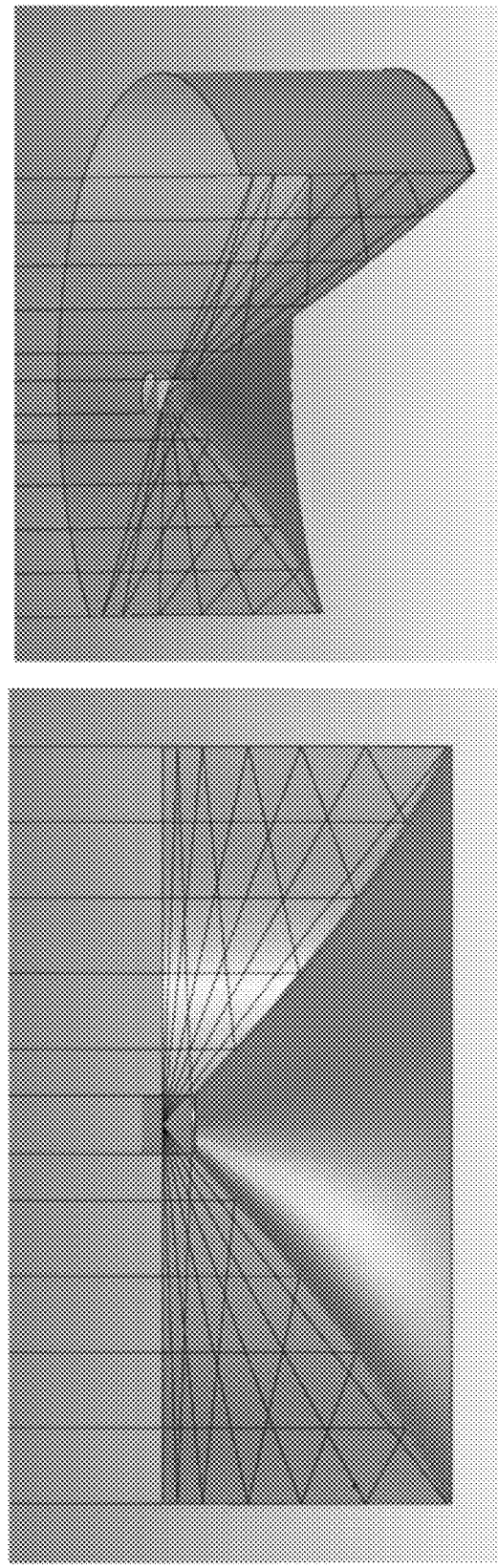
FIG. 3C shows various views of the in-plane reflection of various light rays of the heat exchanger.

FIG. 3B is a table illustrating the system parameters and calculated spot size for a given diameter of the heat exchanger 410, with a primary mirror radius of 2 meters. FIG. 3C shows various views of the in-plane reflection of various light rays of the heat exchanger. Modeling indicates that the efficiency of this system, defined as the percentage of incident rays entering the heat exchanger, is 97%.

In some alternate embodiments, the secondary mirror 420a may be tilted to translate the focal point along the z-axis A tilt angle of the secondary mirror 420a of $\delta$ will result in a change in the angle of the reflected beam of $2\delta$, shifting the focal point below $z_3$. Targeting of the reflected beams lower on the heat exchanger 410 may increase the efficiency of the overall system, when manufacturing imperfections and other factors which may impact the ideal reflection of the incident beams are taken into account.

When a secondary reflector 420a which is flat in cross-sectional shape is used, the light incident on the heat exchanger 410 is non-collimated, such that the reflected energy may be particularly concentrated in specific regions of the heat exchanger 410. In other embodiments, as described above, the secondary reflector may collimate incident light reflected by the primary OAP reflector. This may be done, for example, by using a second reflector with a second focal length $f_2$ which is shorter than the focal length $f_1$ of the primary reflector. In some embodiments, the second reflector may be another OAP reflector, while in other embodiments, the second reflector may have a slightly different geometry, such as a section of a circular toroidal shape which approximates an OAP reflector.

In such an embodiment, the magnification M can be given by the ratio of focal lengths, such that $M=f_1/f_2$. As the area of the reflected beam decreases, its angular extent increases due to Lambert's Law, increasing the expected spot size, and limiting the magnification which can be realistically achieved.

Figure 4A:
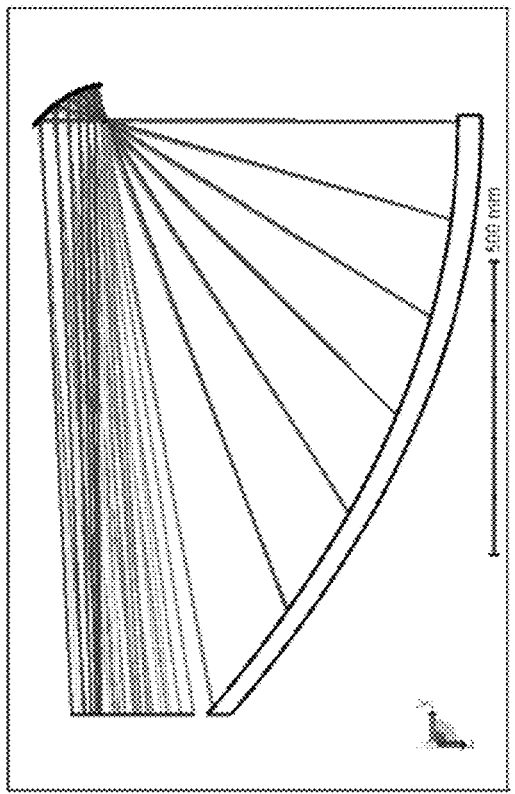
FIG. 4A shows a modeled example of a primary off-axis parabolic (OAP) reflector and a secondary positive OAP reflector, showing only the reflection of on-axis incident solar rays.
Figure 4B:
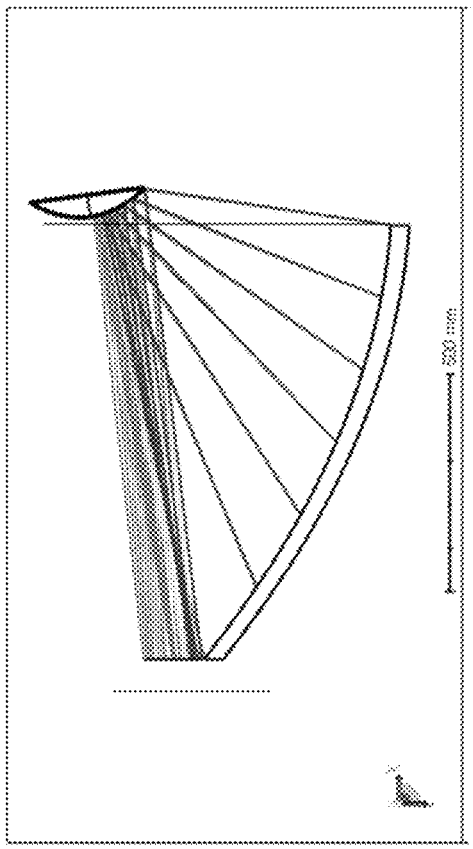
FIG. 4B shows a modeled example of the primary OAP reflector and a secondary positive OAP reflector of FIG. 4A, showing all incident solar rays, including off-axis solar rays.

FIG. 4A shows a modeled example of a primary OAP reflector and a secondary positive OAP reflector, showing only the reflection of on-axis incident solar rays. FIG. 4B shows a modeled example of the primary OAP reflector and a secondary positive OAP reflector of FIG. 4A, showing all incident solar rays, including off-axis solar rays. In the illustrated embodiment, the incoming beam has an extent of 1 meter, the primary reflector has a focal length of 600 mm, and the secondary reflector has a focal length of 60 mm. The resulting spot diameter at the outer circumference of the heat exchanger is roughly 210 mm tall. The angles of incidence range between 3 degrees and 9 degrees, a significant reduction in angular spread compared to a range of 2.2 degrees to 37 degrees when a flat secondary reflector is uses. This observed angular spread is likely affected by coma, resulting in a slight increase in angular spread.

Figure 4C:
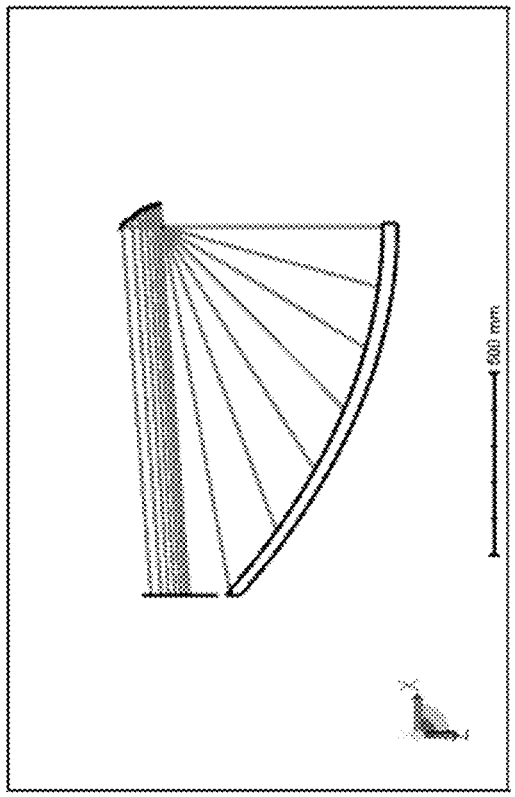
FIG. 4C shows a modeled example of a primary OAP reflector and a secondary negative OAP reflector.

FIG. 4C shows a modeled example of a primary OAP reflector and a secondary negative OAP reflector. Instead of reflecting off of a concave surface as in FIGS. 4A and 4B, the reflective surface of the secondary reflector in FIG. 4C is a convex surface. Slight modifications to the geometry may be required so that the outer edge of the secondary reflector does not shadow the outermost section of the primary reflector. In the modeled embodiment, primary reflector has a focal length of 750 mm, and the secondary reflector has a focal length of 60 mm. The resulting spot diameter at the outer circumference of the heat exchanger is roughly 227 mm tall, and the angles of incidence range between 3 degrees and 10.2 degrees.

Figure 4D:
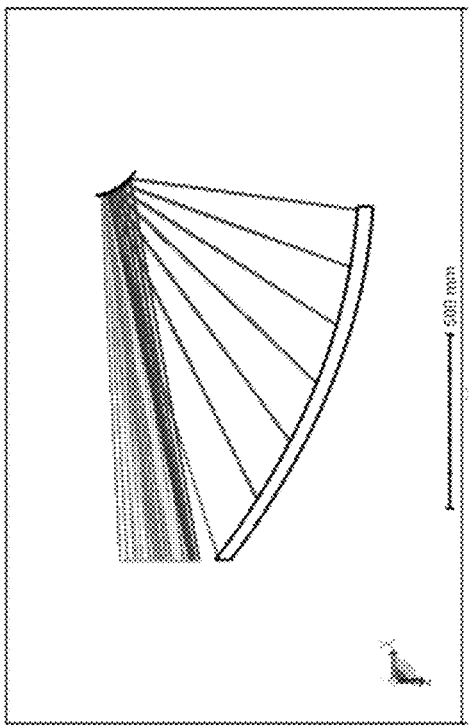
FIG. 4D shows another modeled example of a primary OAP reflector and a secondary negative OAP reflector.

FIG. 4D shows another modeled example of a primary OAP reflector and a secondary negative OAP reflector. In the embodiment modeled in FIG. 4D, the primary reflector has a diameter of 2 m, and the overall system has a diameter of 2.149 m. The primary reflector has a focal length of 700 mm, and the secondary reflector has a focal length of 90 mm. The vertical size of the spot diameter incident upon the outer circumference of the heat exchanger is 133 mm, and the angle of incidence ranges from 4 degrees to 13.2 degrees.

Figure 4E:
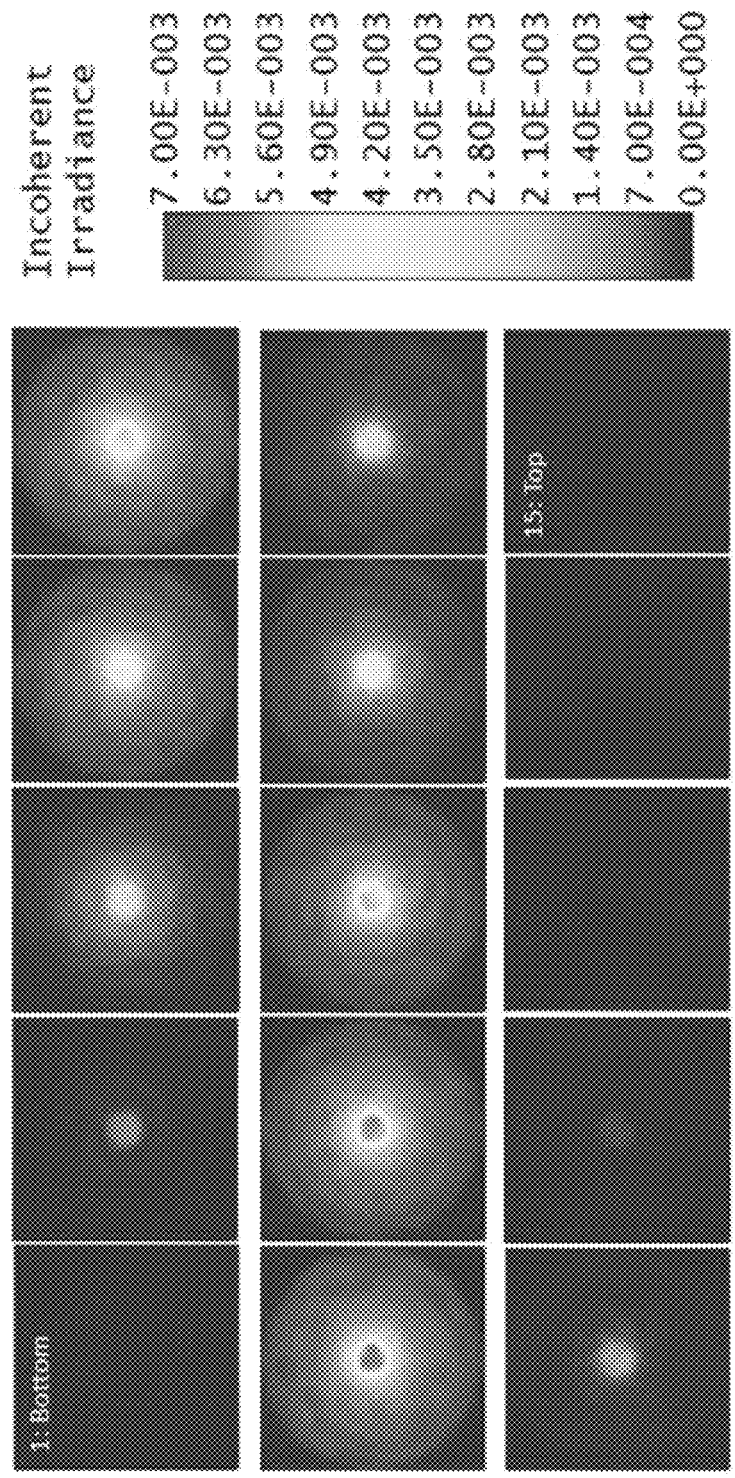
FIG. 4E shows the intensity distribution of power absorption across each element of the heat exchanger.

When the heat exchanger is modeled as 15 thin circular plates, each separated by 10 mm, and each treated as a perfect absorber, modeling indicates that the nominal design provides 100% absorption of the incident power, before accounting for any effects of coating reflectivity. FIG. 4E shows the intensity distribution of power absorption across each element of the heat exchanger, and FIG. 4F shows a table showing the percentage of power absorption for each of the plates.

The relative dimensions of a reflective concentrator such as the embodiments discussed herein can be supported by any suitable structure, including structures which can be moved through a plurality of motors or other mechanisms to control the orientation of the reflective concentrator. Reflective concentrators of the type discussed herein can be significantly more aerodynamically and structurally stable than other types of reflective concentrators, such as parabolic dish concentrators.

In some embodiments, the rear surface of the primary reflector may be left uncovered. In other embodiments, however, a rear cover may be provided to further improve the aerodynamic profile of the reflective collector FIG. 5A is a perspective view of the reflective concentrator surfaces of FIG. 1 and fairing 123. Fairing 123 acts as an aerodynamic fairing to lessen the forces exerted on the collector by the wind and weather.

Figure 5B:
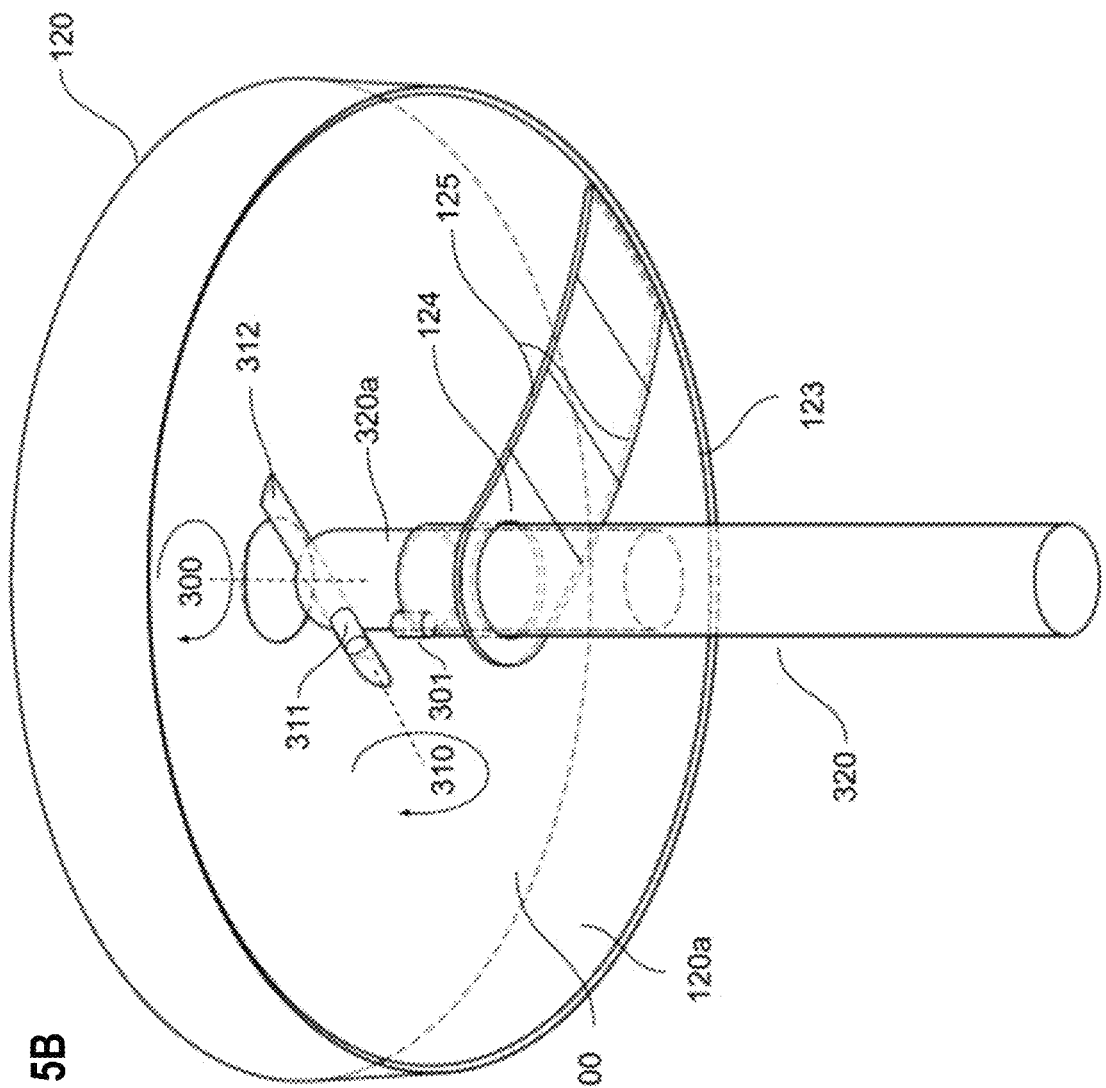
FIG. 5B is a plan perspective view of the reflective concentrator surfaces and target area of the solar concentrator of FIG. 1 including two axis tracker system in a first position and ground mount.

FIG. 5B is a plan perspective view of the reflective concentrator surfaces and target area of the solar concentrator of FIG. 1 including two axis tracker system in a first position and ground mount. Fairing ground mount support 124 is connected to fairing 123 by fairing support tracks 125 which give extra stability to the tracker system. Ground mount 320 supports the two reflector system and elevates it off of the mounting surface to allow for elevation tracking to 90 degrees from vertical. Elevation axis mount 312 allows the two reflector system to pivot 90 degrees from vertical about axis of rotation 310 using elevation axis motor 311. As the elevation is changed, fairing ground mount support 124 translates along fairing support tracks 125. Azimuthal tracking is completed through the relative motion between the ground mount 320 and the Ground mount azimuthal rotor 320a driven by the azimuth motor 301 about azimuth axis of rotation 300.

As can be seen in FIG. 3B, the tracking system can be driven by two motors, the azimuth motor 301 and the elevation axis motor 311. The reflector assembly is supported at two locations, the upper elevation pin and the fairing ground mount support 124.

In such an embodiment, the reflector assembly is more efficiently supported via internal structural supports, in comparison to less efficient external supports. Such an assembly can provide a lighter, less-expensive structure. This is also supported at the centerpoint of the reflector assembly, rather than being cantilevered, reducing the generation of resonant frequencies relative to a cantilevered support system.

Because the reflector assembly can be roughly three times as wide as it is deep, the size of the area that the tracked reflector assembly sweeps through as it is rotated is substantially less than a dish-style collector, which may have a depth which is roughly equal to its width.

FIG. 5C is a rear perspective view of the reflective concentrator surfaces and target area of the solar concentrator of FIG. 1 including two axis tracker system in a second position and ground mount.

FIG. 6 is a perspective view of another example of a three bearing swivel tracking mechanism and reflector system of FIG. 1.

Figure 7A:
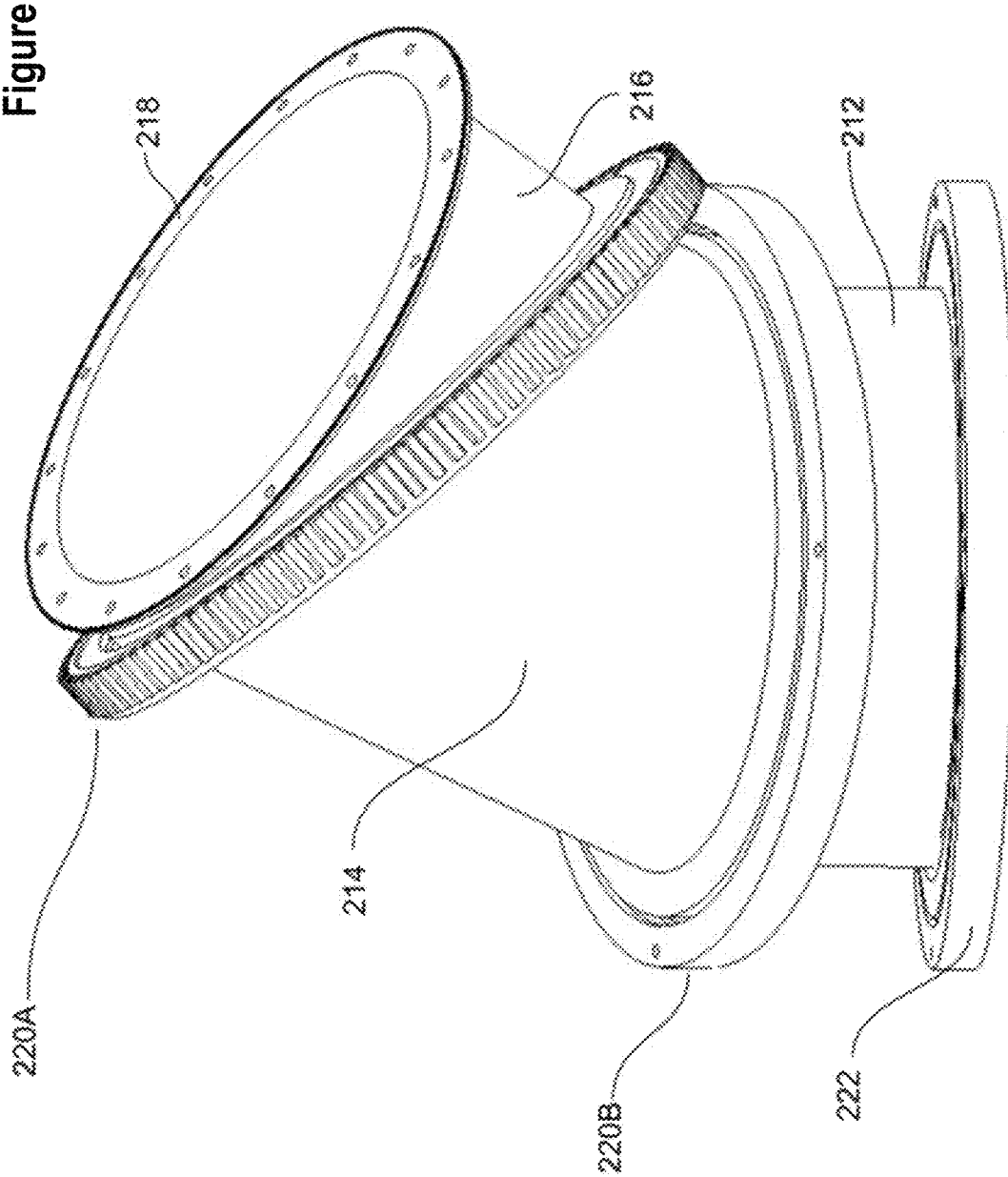
FIG. 7A is a side view of the three bearing swivel tracking mechanism.
Figure 7E:
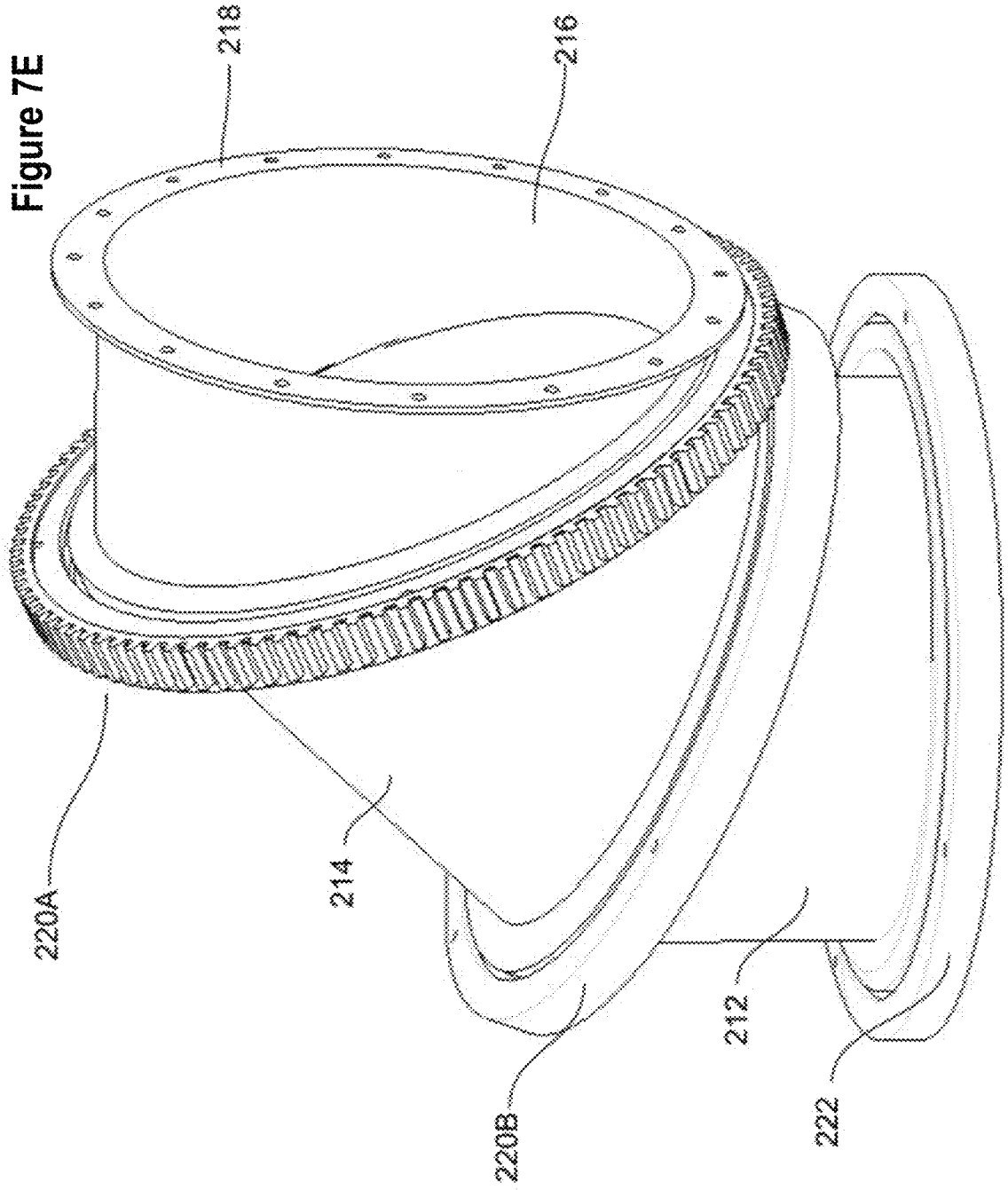
FIG. 7E is a perspective view of the three bearing swivel tracking mechanism of FIG. 7A in a third position.

FIG. 7A is a side view of a three bearing swivel tracking mechanism. FIG. 7B is a perspective cross section view of the three bearing swivel tracking mechanism of FIG. 7A. FIG. 7C is a perspective view of the three bearing swivel tracking mechanism of FIG. 5A in a first position. FIG. 7D is a perspective view of the three bearing swivel tracking mechanism of FIG. 7A in a second position. FIG. 7E is a perspective view of the three bearing swivel tracking mechanism of FIG. 7A in a third position.

The three bearing swivel tracking mechanism of FIGS. 7A to 7E can be light, stiff, and provide precise orientation control, while still being inexpensive. Such a tracker sits inside of the collector volume, and is therefore fundamentally counterbalanced.

In a solar tracking system, the bearings can have very low turning rates, so the bearings can be made of plastic-on-plastic bushings or other suitable structures, which can be much cheaper and stiffer than conventional bearings, and which will not undergo substantial wear or require lubrication or maintenance.

Similarly, applied torque forces from the collector generally do not induce rotation forces on the bearings. This allows for the use of control motors with small holding torque, and light duty geared linkages.

Additional details regarding the reflector design and optical performance of reflector assemblies described herein and similar reflectors are provided in the attached Appendix.

In the foregoing description, specific details are given to provide a thorough understanding of the examples. However, it will be understood by one of ordinary skill in the art that the examples may be practiced without these specific details. Certain embodiments that are described separately herein can be combined in a single embodiment, and the features described with reference to a given embodiment also can be implemented in multiple embodiments separately or in any suitable subcombination. In some examples, certain structures and techniques may be shown in greater detail than other structures or techniques to further explain the examples.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A solar collector, comprising:
   a primary reflector comprising a concave curved conical surface symmetrical about a central axis of the solar collector and configured to redirect substantially all incident sunlight parallel to the central axis outwardly and away from the central axis and through a toroidal region rotationally symmetrical about the central axis when a peak of the primary reflector is oriented toward the incident sunlight;
   a secondary reflector configured to redirect substantially all of the parallel incident sunlight redirected from the first primary reflector towards a collector region near the peak of the primary reflector.

2. The solar collector of claim 1, wherein the toroidal region is one of concave or convex.

3. The solar collector of claim 1, wherein the toroidal region is one of parabolic, circular, cylindrical, or tilted conical.

4. The solar collector of claim 1, wherein the secondary reflector comprises a rotationally symmetric concave reflective surface facing the primary reflector, the reflective surface substantially identical in shape to a boundary of the toroidal region facing the primary reflector.

5. The solar collector of claim 1, wherein the secondary reflector comprises a rotationally symmetric convex reflective surface facing the primary reflector, the reflective surface substantially identical in shape to a boundary of the toroidal region facing the primary reflector.

6. The solar collector of claim 1, wherein the secondary reflector is located radially outward of the primary reflector.

7. The solar collector of claim 1, wherein the secondary reflector is supported by a plurality of support components extending between the secondary reflector and the primary reflector, at least some of the plurality of support components being spaced apart from one another to allow airflow therebetween.

8. The solar collector of claim 1, wherein the radius of the toroidal region is substantially greater than the thickness of the toroidal region, or wherein the radius of the toroidal region is more than 4 times the thickness of the toroidal region.

9. The solar collector of claim 1, wherein the parallel incident sunlight redirected from the secondary reflector to the collector region is substantially parallel with a plane orthogonal to the central axis of the solar collector.

10. The solar collector of claim 1, wherein the parallel incident sunlight redirected from the secondary reflector to the collector region is redirected at angles parallel to or slightly downward towards the primary reflector.

11. The solar collector of claim 1, additionally comprising a heat engine positioned within the collector region near the peak of the primary reflector.

12. The solar collector of claim 11, wherein the heat engine comprises an evaporator region, and wherein a substantial percentage of the parallel incident sunlight redirected from the secondary reflector is incident upon the evaporator region of the heat engine.

13. The solar collector of claim 1, wherein the solar collector comprises an aerodynamic fairing disposed on the side of the primary reflector opposite the concave conical surface.

14. The solar collector of claim 13, wherein the primary reflector and aerodynamic fairing define an aerodynamically stable structure.

15. The solar collector of claim 14, additionally comprising an elevation axis mount configured to allow the elevation of the primary reflector to be adjusted.

16. The solar collector of claim 14, additionally comprising an azimuthal motor configured to allow the rotational position of the primary reflector to be adjusted.

17. The solar collector of claim 14, wherein the solar collector is supported by a ground mount support, and wherein the solar collector additionally comprises a radially extending fairing support track along which the ground mount support can translate when the elevation of the primary reflector is adjusted.

18. The solar collector of claim 1, wherein:
   the concave curved conical surface is a rotationally symmetric concave curved conical reflective surface, each radial section of the concave curved conical reflective surface comprising an off-axis parabolic section having a first focal length and a focal point radially outward of the primary reflector; and
   the secondary reflector comprises a rotationally symmetric curved reflective surface located at least partially radially outward of the primary reflector.

19. The solar collector of claim 18, wherein the secondary reflector comprises a concave curved surface facing the primary reflector.

20. The solar collector of claim 18, wherein the secondary reflector comprises a convex curved surface facing the primary reflector.

21. The solar collector of claim 18, wherein the secondary reflector comprises a recollimating structure configured to redirect light reflected by the primary reflector back towards a target located near the center of the primary reflector.

22. The solar collector of claim 1, wherein the primary reflector reflects incident sunlight in a radially outward direction relative to the incident sunlight.

23. The solar collector of claim 22, wherein a magnitude of an angle between the incident sunlight and the radially outward direction at which the incident sunlight is reflected decreases with increased distance between the peak of the primary reflector and a point on the primary reflector at which the incident sunlight is reflected.

24. The solar collector of claim 1, wherein the primary reflector extends downward and outward from the collector region near the peak of the primary reflector.

25. The solar collector of claim 1, wherein neither the primary reflector nor the secondary reflector is located between the collector region and the incident sunlight parallel to the central axis.

* * * * *